United States Patent
Chang et al.

(10) Patent No.: US 10,468,407 B2
(45) Date of Patent: Nov. 5, 2019

(54) FIN FIELD EFFECT TRANSISTOR (FINFET) DEVICE STRUCTURE WITH UNEVEN GATE STRUCTURE

(71) Applicant: Taiwan Semiconductor Manufacturing Company, Ltd., Hsinchu (TW)

(72) Inventors: Chai-Wei Chang, New Taipei (TW); Che-Cheng Chang, New Taipei (TW); Po-Chi Wu, Zhubei (TW); Yi-Cheng Chao, Lukang Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/445,664

(22) Filed: Feb. 28, 2017

(65) Prior Publication Data
US 2017/0179123 A1     Jun. 22, 2017

Related U.S. Application Data

(62) Division of application No. 14/737,066, filed on Jun. 11, 2015, now Pat. No. 9,583,485.
(Continued)

(51) Int. Cl.
*H01L 27/088* (2006.01)
*H01L 29/06* (2006.01)
(Continued)

(52) U.S. Cl.
CPC .... *H01L 27/0886* (2013.01); *H01L 21/32136* (2013.01); *H01L 21/76224* (2013.01);
(Continued)

(58) Field of Classification Search
CPC ....... H01L 21/82385; H01L 21/823431; H01L 21/823456; H01L 21/823462;
(Continued)

(56) References Cited

U.S. PATENT DOCUMENTS 4,786,360 A    11/1988    Cote et al.
5,960,270 A *   9/1999    Misra ................ H01L 21/2257
                                                  257/E21.151
(Continued)

FOREIGN PATENT DOCUMENTS

CN    103219231 A    7/2013
CN    104347426 A    2/2015
(Continued)

OTHER PUBLICATIONS

Polishchuk, Igor et al. "Dual Work Function Metal Gate CMOS Transistors by Ni—Ti Interdiffusion," IEEE Electron Device Letters, vol. 23, No. 4, Apr. 2002, pp. 200-202.

*Primary Examiner* — Matthew L Reames
*Assistant Examiner* — John A Bodnar
(74) *Attorney, Agent, or Firm* — Slater Matsil, LLP

(57) ABSTRACT

A FinFET device structure is provided. The FinFET device structure includes an isolation structure formed over a substrate and a fin structure formed over the substrate. The FinFET device structure includes a first gate structure and a second gate structure formed over the fin structure, and the first gate structure has a first width in a direction parallel to the fin structure, the second gate structure has a second width in a direction parallel to the fin structure, and the first width is smaller than the second width. The first gate structure includes a first work function layer having a first height. The second gate structure includes a second work
(Continued)

function layer having a second height and a gap between the first height and the second height is in a range from about 1 nm to about 6 nm.

19 Claims, 25 Drawing Sheets

Related U.S. Application Data

(60) Provisional application No. 62/165,569, filed on May 22, 2015.

(51) Int. Cl.
| | | |
|---|---|---|
| H01L 29/49 | (2006.01) | |
| H01L 27/02 | (2006.01) | |
| H01L 21/8234 | (2006.01) | |
| H01L 29/66 | (2006.01) | |
| H01L 21/762 | (2006.01) | |
| H01L 29/423 | (2006.01) | |
| H01L 21/3213 | (2006.01) | |

(52) U.S. Cl.
CPC ........ *H01L 21/823431* (2013.01); *H01L 21/823456* (2013.01); *H01L 21/823462* (2013.01); *H01L 21/823481* (2013.01); *H01L 27/0207* (2013.01); *H01L 29/0649* (2013.01); *H01L 29/0653* (2013.01); *H01L 29/42372* (2013.01); *H01L 29/4958* (2013.01); *H01L 29/4966* (2013.01); *H01L 29/66545* (2013.01)

(58) Field of Classification Search
CPC ......... H01L 21/823821; H01L 21/845; H01L 27/0924; H01L 27/10879; H01L 27/10826; H01L 29/0886; H01L 29/42372; H01L 29/42376; H01L 29/4958; H01L 29/4966
See application file for complete search history.

(56) References Cited

U.S. PATENT DOCUMENTS

| | | | |
|---|---|---|---|
| 6,093,332 A | 7/2000 | Winniczek et al. | |
| 6,855,989 B1 | 2/2005 | Wang et al. | |
| 7,232,762 B2 | 6/2007 | Chang et al. | |
| 7,718,538 B2 | 5/2010 | Kim et al. | |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,883,648 B1 | 11/2014 | Hsieh et al. | |
| 8,887,106 B2 | 11/2014 | Ho et al. | |
| 8,969,878 B2 | 3/2015 | Kim | |
| 9,012,319 B1 | 4/2015 | Choi et al. | |
| 9,209,273 B1* | 12/2015 | Lin | H01L 29/4232 |
| 9,245,805 B2 | 1/2016 | Yeh et al. | |
| 9,252,238 B1 | 2/2016 | Trevino et al. | |
| 9,318,389 B1* | 4/2016 | Yang | H01L 21/82345 |
| 9,508,715 B1* | 11/2016 | Feng | H01L 21/2257 |
| | | | 257/E21.151 |
| 2005/0054192 A1 | 3/2005 | Kang et al. | |
| 2005/0106882 A1 | 5/2005 | Chao et al. | |
| 2005/0148137 A1* | 7/2005 | Brask | H01L 21/823821 |
| | | | 438/216 |
| 2007/0123036 A1 | 5/2007 | Brakensiek et al. | |
| 2007/0259501 A1 | 11/2007 | Xiong et al. | |
| 2008/0197110 A1 | 8/2008 | Kim et al. | |
| 2009/0191711 A1 | 7/2009 | Rui et al. | |
| 2010/0129984 A1 | 5/2010 | Vakanas et al. | |
| 2010/0270619 A1 | 10/2010 | Lee | |
| 2012/0049279 A1 | 3/2012 | Shrivastava et al. | |
| 2013/0161762 A1 | 6/2013 | Kelly et al. | |
| 2013/0187236 A1* | 7/2013 | Xie | H01L 29/4966 |
| | | | 257/369 |
| 2013/0320412 A1 | 12/2013 | Yamasaki | |
| 2013/0328111 A1 | 12/2013 | Xie et al. | |
| 2014/0048867 A1 | 2/2014 | Toh et al. | |
| 2014/0061817 A1 | 3/2014 | Gan et al. | |
| 2014/0061917 A1 | 3/2014 | Kim et al. | |
| 2014/0070320 A1* | 3/2014 | Mukherjee | H01L 21/823456 |
| | | | 257/368 |
| 2014/0191325 A1 | 7/2014 | Chowdhury et al. | |
| 2014/0203333 A1 | 7/2014 | Huang et al. | |
| 2014/0282326 A1 | 9/2014 | Chen et al. | |
| 2014/0367790 A1 | 12/2014 | Choi et al. | |
| 2015/0021694 A1 | 1/2015 | Trevino et al. | |
| 2015/0041905 A1* | 2/2015 | Xie | H01L 29/6656 |
| | | | 257/369 |
| 2015/0126023 A1 | 5/2015 | Choi et al. | |
| 2015/0145027 A1 | 5/2015 | Lin et al. | |
| 2015/0206963 A1 | 7/2015 | Ho et al. | |
| 2015/0243564 A1 | 8/2015 | Zhao | |
| 2016/0005658 A1* | 1/2016 | Lin | H01L 21/823456 |
| | | | 257/392 |
| 2016/0163601 A1* | 6/2016 | Xie | H01L 21/823821 |
| | | | 438/216 |

FOREIGN PATENT DOCUMENTS

| | | |
|---|---|---|
| DE | 102013104744 A1 | 12/2013 |
| DE | 102013215671 A1 | 3/2014 |
| DE | 102014222289 A1 | 5/2015 |
| DE | 102014019257 A1 | 7/2015 |
| JP | 2011071517 A | 4/2011 |
| KR | 100823874 B1 | 4/2008 |
| KR | 1020100014502 A | 2/2010 |
| KR | 1020130127257 A | 11/2013 |
| KR | 1020150000267 A | 1/2015 |
| TW | 201133793 A | 10/2011 |
| TW | I485842 B | 5/2015 |

* cited by examiner

FIN FIELD EFFECT TRANSISTOR (FINFET) DEVICE STRUCTURE WITH UNEVEN GATE STRUCTURE

PRIORITY CLAIM AND CROSS-REFERENCE

This application is a divisional of U.S. patent application Ser. No. 14/737,066, filed on Jun. 11, 2015, and entitled "Fin Field Effect Transistor (FinFET) Device Structure with Uneven Gate Structure and Method for Forming the Same" which claims priority to U.S. Provisional Patent Application No. 62/165,569 filed May 22, 2015, and entitled "Fin Field Effect Transistor (FinFET) Device Structure with Uneven Gate Structure and Method for Forming the Same," which applications are incorporated herein by reference.

This application is related to the following co-pending and commonly assigned patent applications: U.S. patent application Ser. No. 14/713,517, filed on May 15, 2015 and entitled "Semiconductor Structure with Unleveled Gate Structure and Method for Forming the Same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
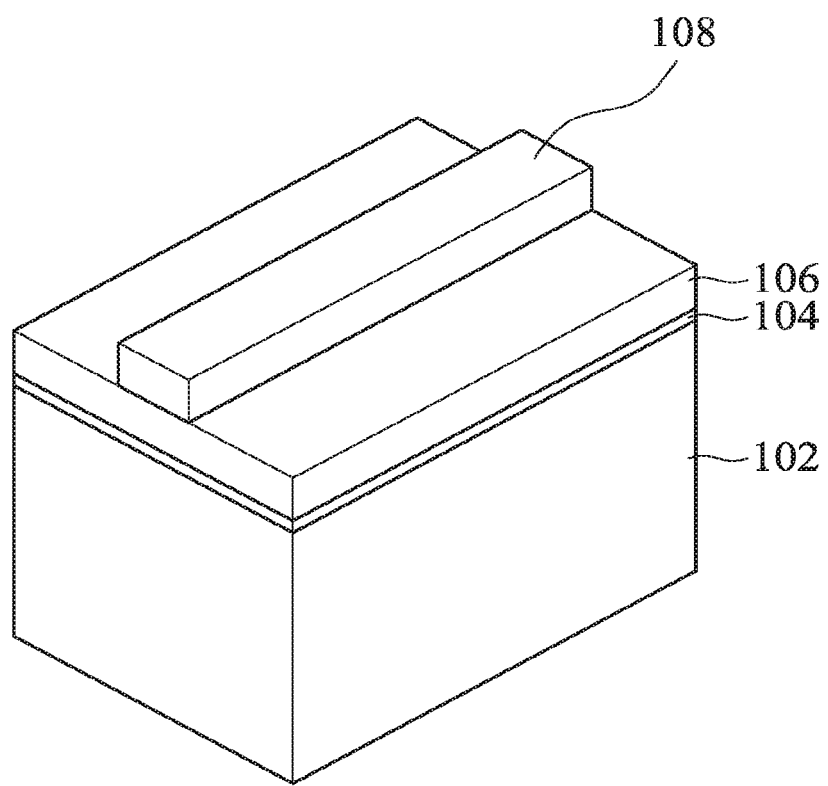
FIGS. 1A-1H show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure are provided. FIGS. 1A-1H show perspective representations of various stages of forming a FinFET device structure 100, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, high-density plasma chemical vapor deposition (HDPCVD) process, spin-on process, sputtering process, or another applicable process.

Figure 1B:
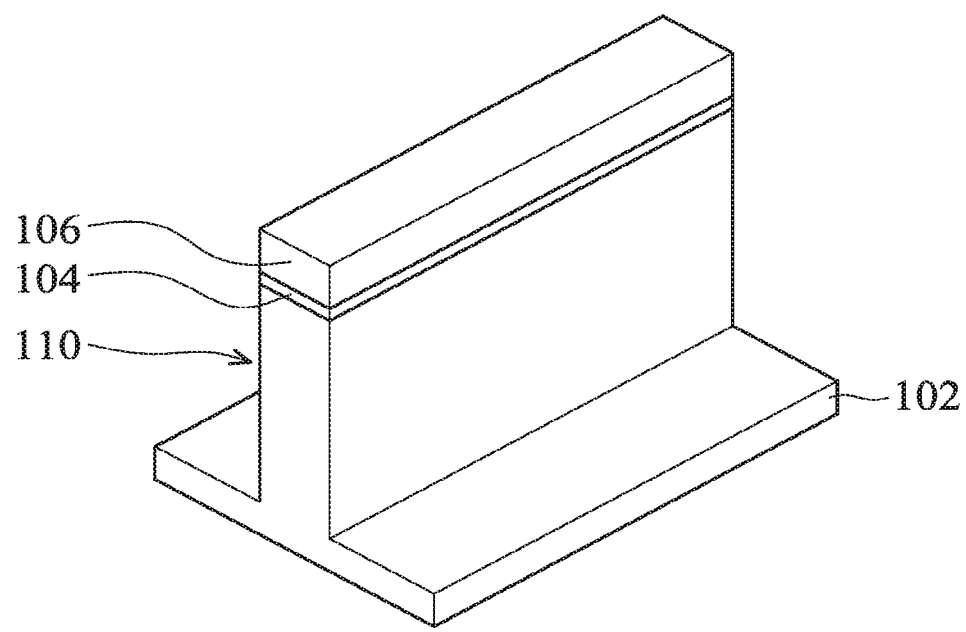

After the photoresist layer 108 is patterned, the dielectric layer 104 and the mask layer 106 are patterned by using the patterned photoresist layer 108 as a mask as shown in FIG. 1B, in accordance with some embodiments. As a result, a patterned pad layer 104 and a patterned mask layer 106 are obtained. Afterwards, the patterned photoresist layer 108 is removed.

Afterwards, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched by a dry etching process. The dry etching process includes using the fluorine-based etchant gas, such as $SF_6$, $C_xF_y$, $NF_3$ or combinations thereof. The etching process may be a time-controlled process, and continue until the fin structure 110 reach a predetermined height. In some other embodiments, the fin structure 110 has a width that gradually increases from the top portion to the lower portion.

Figure 1C:
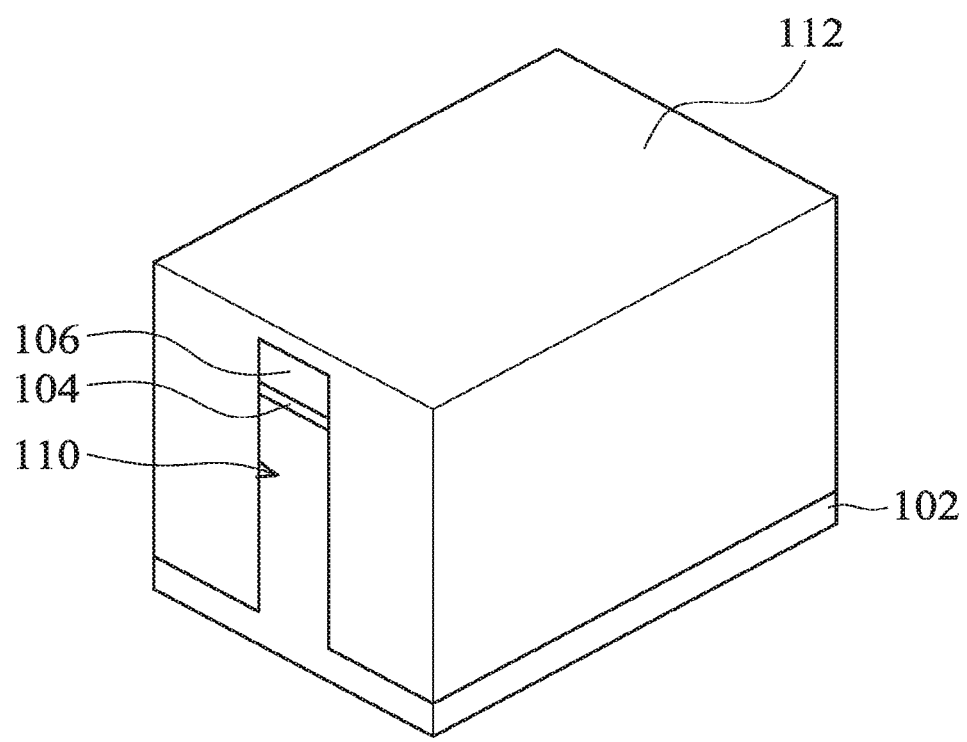

After the fin structure 110 is formed, the patterned dielectric layer 104 and the patterned mask layer 106 are removed. An insulating layer 112 is formed to cover the fin structure 110 over the substrate 102 as shown in FIG. 1C, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Figure 1D:
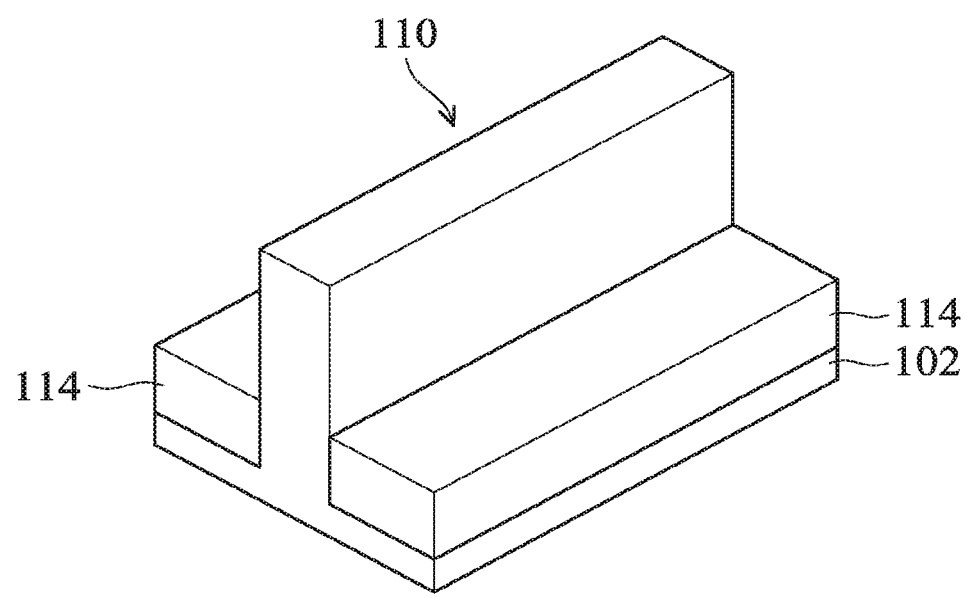

Afterwards, the insulating layer 112 is thinned or planarized to expose the top surface of the fin structure 110 as shown in FIG. 1D, in accordance with some embodiments. In some embodiments, the insulating layer 112 is thinned by a chemical mechanical polishing (CMP) process.

As a result, an isolation structure 114, such as a shallow trench isolation (STI) structure, surrounds the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

Figure 1E:
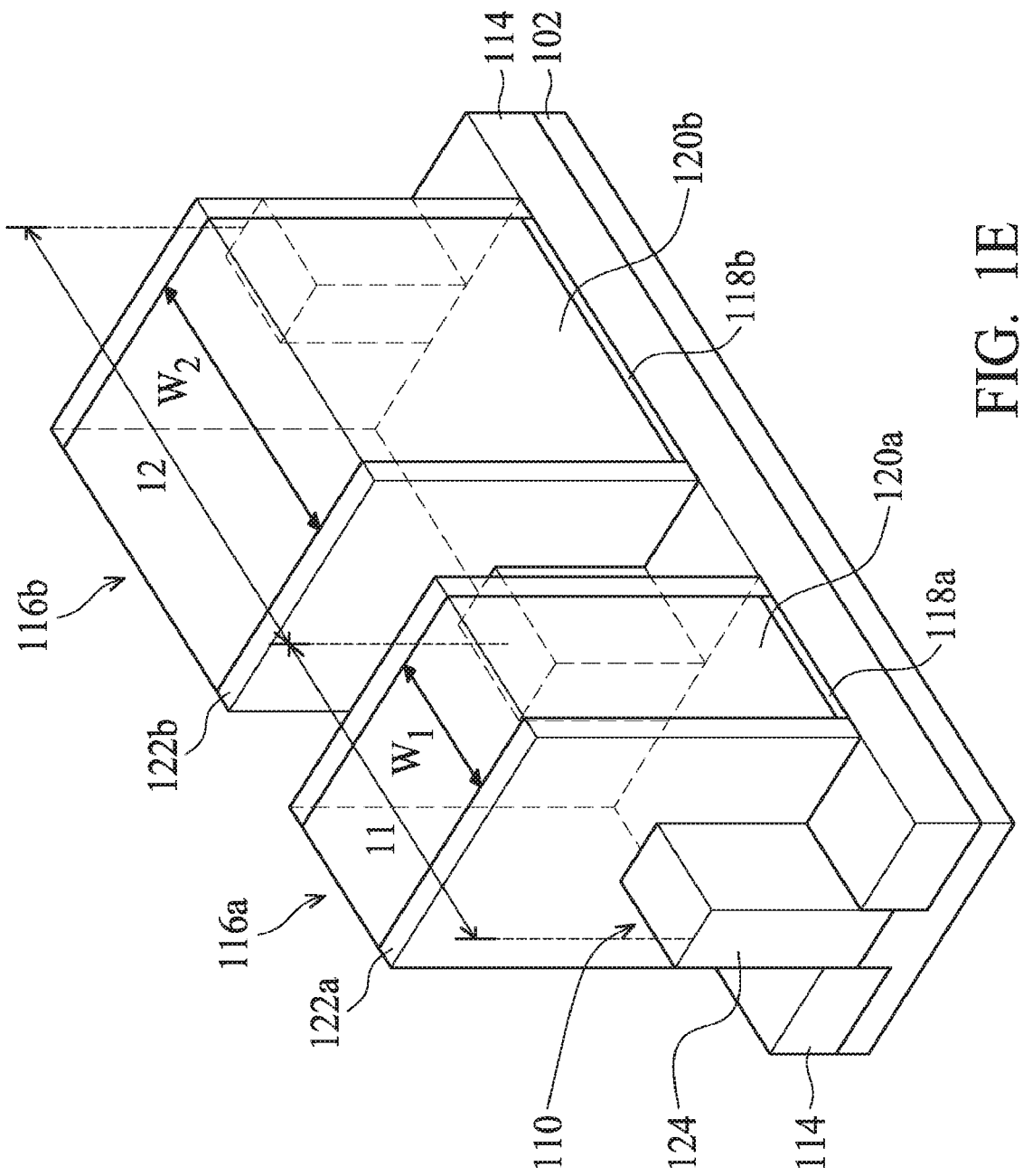

Afterwards, a first dummy gate structure 116a and a second dummy gate structure 116b are formed across the fin structure 110 and extends over the isolation structure 114 as shown in FIG. 1E, in accordance with some embodiments. The first dummy gate structure 116a is formed in a first region 11 and the second dummy gate structure 116b is formed in a second region 12.

In some embodiments, the first dummy gate structure 116a includes a first dummy gate dielectric layer 118a and a first dummy gate electrode layer 120a formed over the first dummy gate dielectric layer 118a. In some embodiments, the second dummy gate structure 116b includes a second dummy gate dielectric layer 118b and a second dummy gate electrode layer 120b formed over the second dummy gate dielectric layer 118b.

After the first dummy gate structure 116a and the second dummy gate structure 116b are formed, first spacers 122a are formed on the opposite sidewalls of the first dummy gate structure 116a, and second spacers 122b are formed on the opposite sidewalls of the second dummy gate structure 116b. The first spacers 122a and the second spacers 122b may be a single layer or multiple layers.

In some embodiments, the first dummy gate structure 116a has a first width $W_1$ in a direction parallel to the fin structure 110, and the second dummy gate structure 116b has a second width $W_2$ in a direction parallel to the fin structure 110. In other words, the first width $W_1$ is measured from an edge of the first spacers 122a to an edge of the opposite first spacer 122a. The second width $W_2$ is measured from an edge of the second spacers 122b to an edge of the opposite second spacer 122b. The first width $W_1$ is smaller than the second width $W_2$.

Afterwards, source/drain (S/D) structures 124 are formed in the fin structure 110. In some embodiments, portions of the fin structure 110 adjacent to the first dummy gate structure 116a and the second dummy gate structure 116b are recessed to form recesses at two sides of fin structure 110, and a strained material is grown in the recesses by an epitaxial (epi) process to form the source/drain (S/D) structures 124. In addition, the lattice constant of the strained material may be different from the lattice constant of the substrate 102. In some embodiments, the source/drain structures 124 include Ge, SiGe, InAs, InGaAs, InSb, GaAs, GaSb, InAlP, InP, or the like.

Figure 1F:
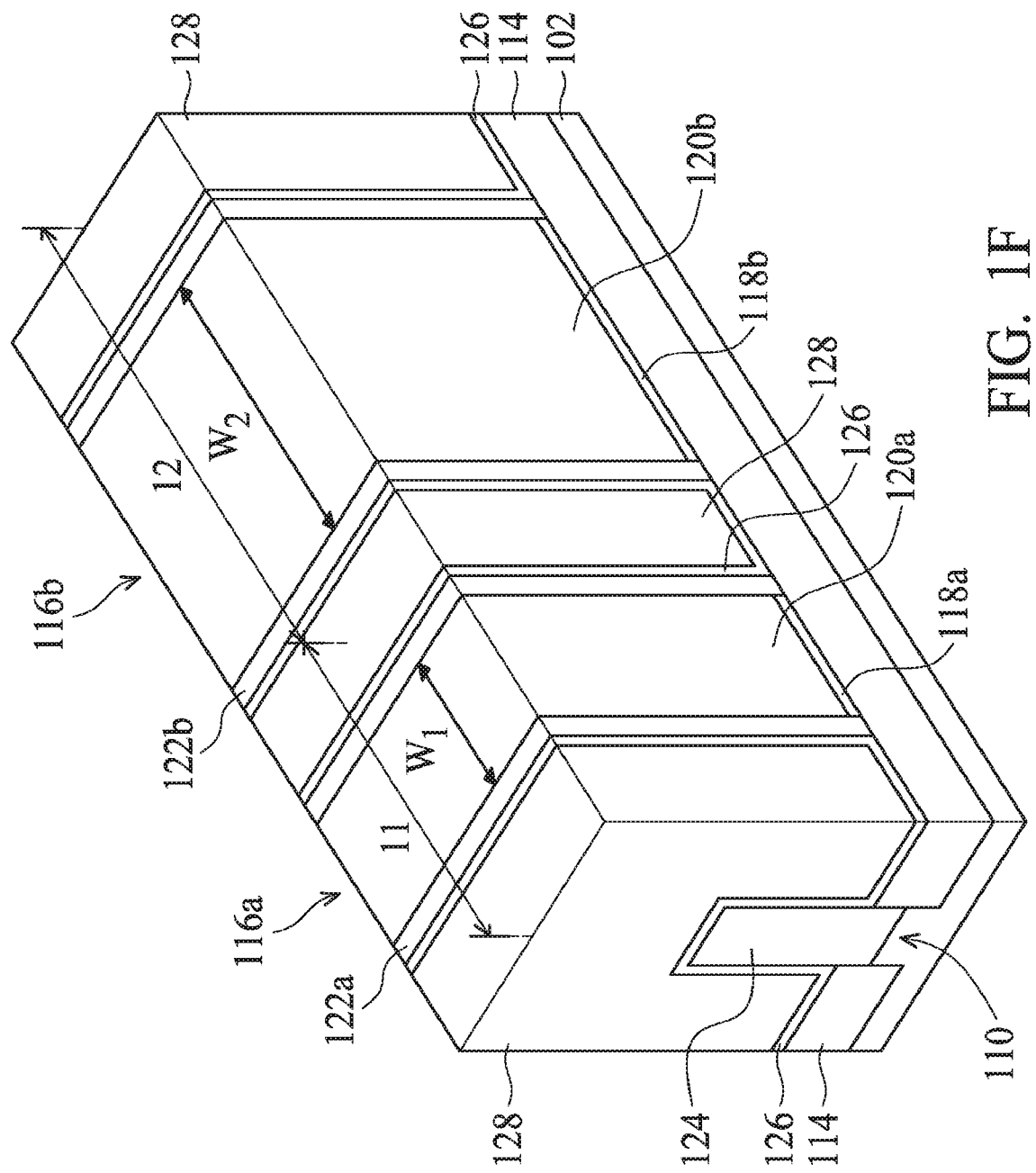

After the source/drain structures 124 are formed, a contact etch stop layer (CESL) 126 is formed over the substrate 102, and an inter-layer dielectric (ILD) structure 128 is formed over the contact etch stop layer 126 as shown in FIG. 1F, in accordance with some embodiments. In some embodiments, the contact etch stop layer 126 is made of silicon nitride, silicon oxynitride, and/or other applicable materials. The contact etch stop layer 126 may be formed by plasma enhanced CVD, low pressure CVD, ALD, or other applicable processes.

The ILD structure 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 128 may be formed by chemical vapor deposition (CVD), physical vapor deposition, (PVD), atomic layer deposition (ALD), spin-on coating, or other applicable processes.

Afterwards, a polishing process is performed to the ILD structure 128 until the top surface of the first dummy gate structure 116a and the top surface of the second dummy gate structure 116 bare exposed. In some embodiments, the ILD structure 128 is planarized by a chemical mechanical polishing (CMP) process.

Figure 1G:
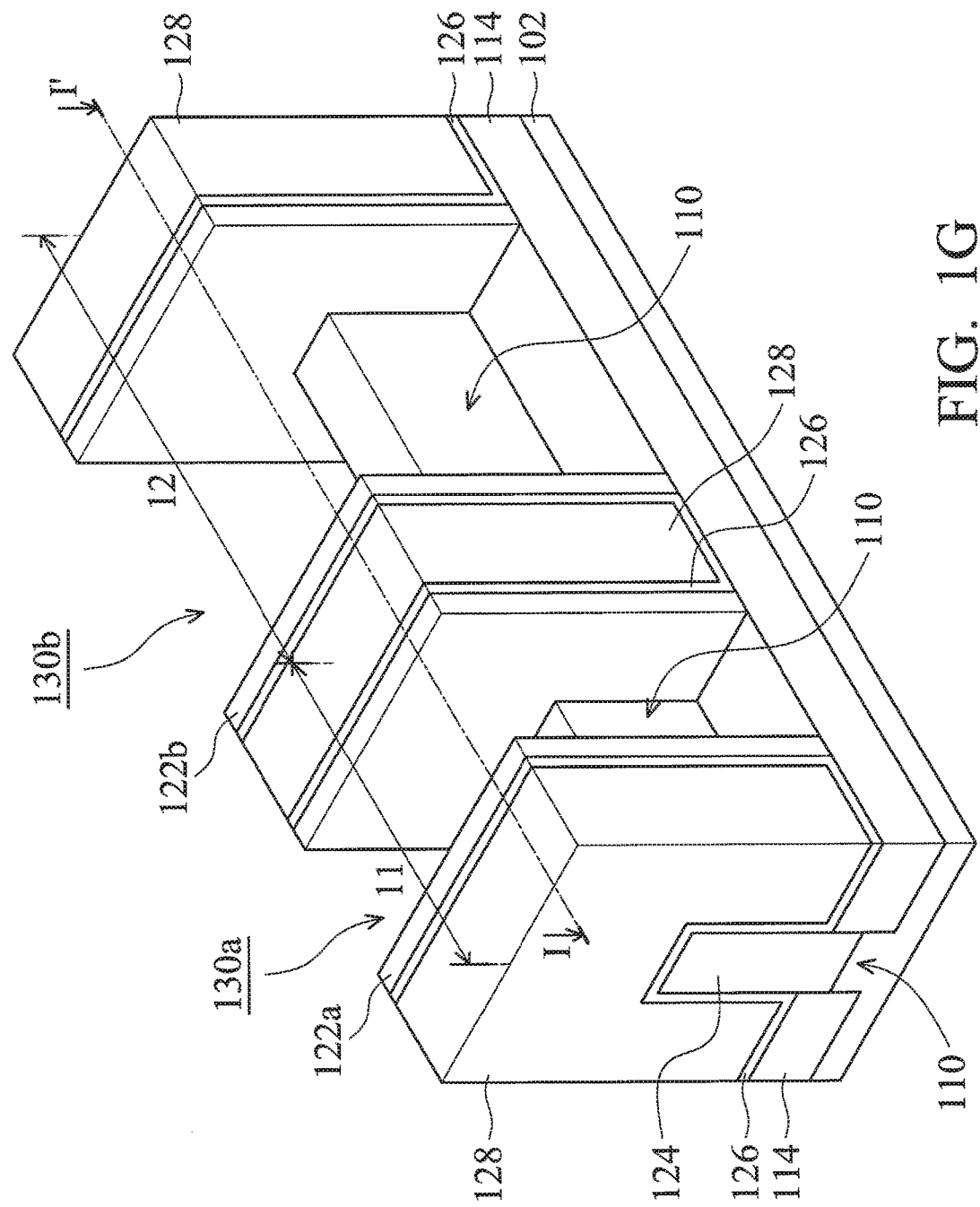

After the ILD structure 128 is formed, the first dummy gate structure 116a is removed to form a first trench 130a in the ILD structure 128 and the second dummy gate structure 116b is removed to form a second trench 130b in the ILD structure 128 as shown in FIG. 1G, in accordance with some embodiments. The first dummy gate structure 116a and the second dummy gate structure 116b may be removed by a wet etching process or a dry etching process.

Figure 1H:
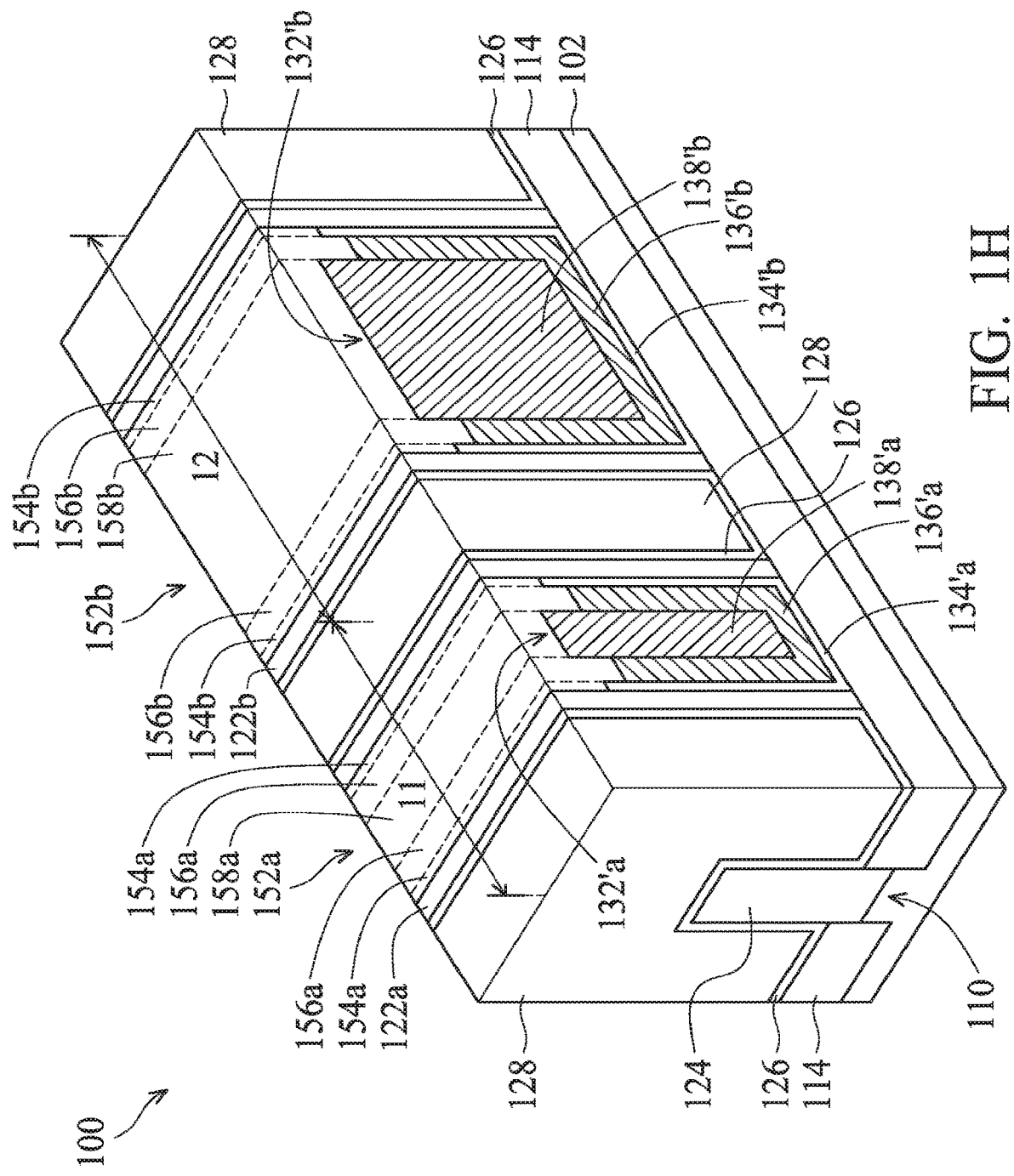

After the first trench 130a and the second trench 130b are formed, a first etched gate structure 132'a and a second etched gate structure 132'b are formed in the first trench 130a and the second trench 130b, respectively, as shown in FIG. 1H, in accordance with some embodiments.

The first etched gate structure 132'a includes a first etched gate dielectric layer 134'a, a first etched work function layer 136'a and a first gate electrode layer 138'a. The second etched gate structure 132'b includes a second etched gate dielectric layer 134'b, a second etched work function layer 136'b and a second gate electrode layer 138'b. The first etched gate structure 132'a has an unleveled top surface, and the second etched gate structure 132'b has an unleveled top surface.

A first hard mask structure 152a is formed over the first etched gate structure 132'a, and a second hardmask layer 152b is formed over the second etched gate structure 132'b. The first hard mask structure 152a includes a first portion 154a, a second portion 156a and a third portion 158a, and the thicknesses of the portion 154a, the second portion 156a and the third portion 158a are different.

Figure 2A:
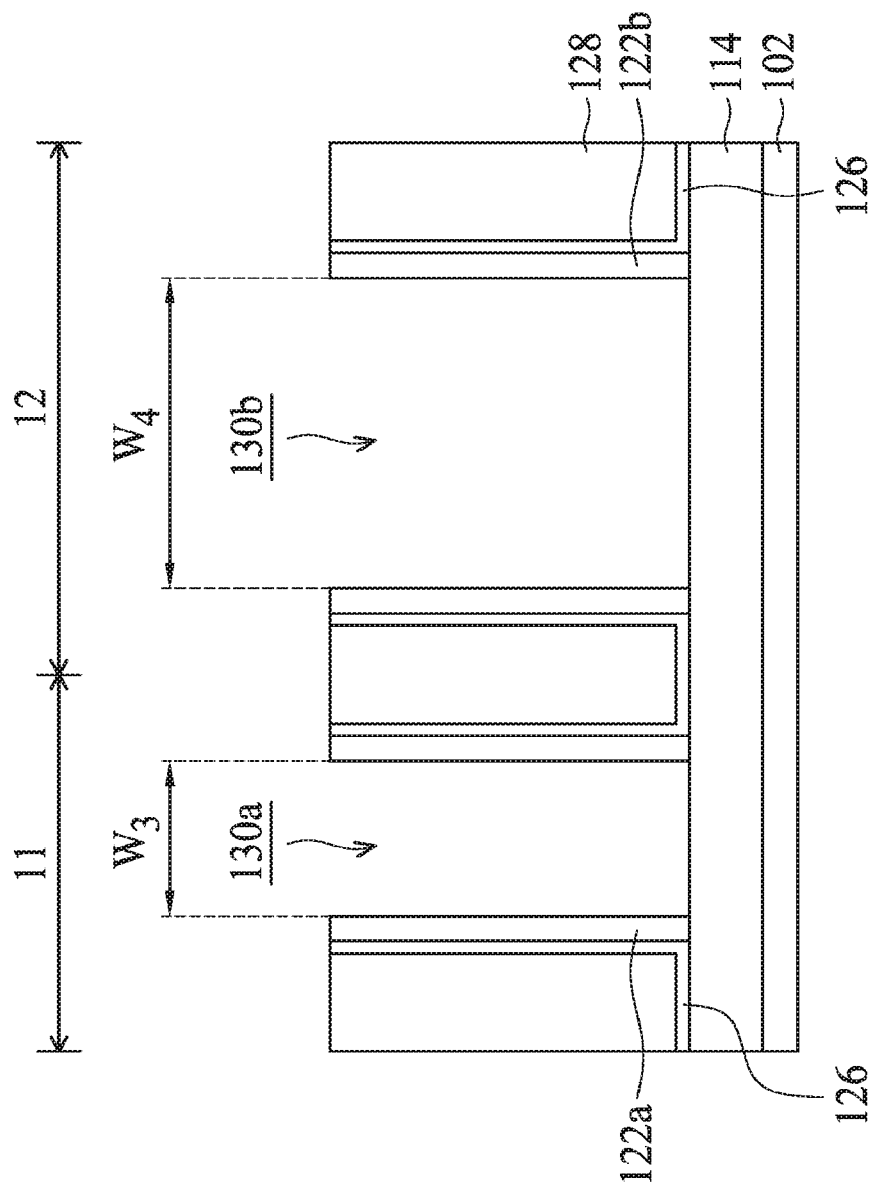
FIGS. 2A-2J show cross-sectional representations of various stages of forming a FinFET device structure shown in FIG. 1G-1H, in accordance with some embodiments of the disclosure.

FIGS. 2A-2J show cross-sectional representations of various stages of forming a FinFET device structure shown in FIG. 1G-1H, in accordance with some embodiments of the disclosure. FIG. 2A is a cross-sectional representation taken along the II' line of FIG. 1 G.

Referring to FIG. 2A, the first trench 130a is formed between the first spacers 122a in the first region 11, and the second spacers 130b is formed between the second spacers 122b in the second region 12. The first trench 130a has a third width $W_3$ in a direction parallel to the fin structure 110, and the second trench has a fourth width $W_4$ in a direction parallel to the fin structure 110. Third width $W_3$ is substantially equal to the first width $W_1$ (shown in FIG. 1E). The fourth width $W_4$ is substantially equal to the second width $W_2$ (shown in FIG. 1E).

The third width $W_3$ is smaller than the fourth width $W_4$. The fourth width $W_4$ is greater than the third width $W_3$. In some embodiments, the third width $W_3$ is in a range from about 10 nm to about 100 nm. In some embodiments, the fourth width $W_4$ is in a range from about 101 nm to about 500 nm.

Figure 2B:
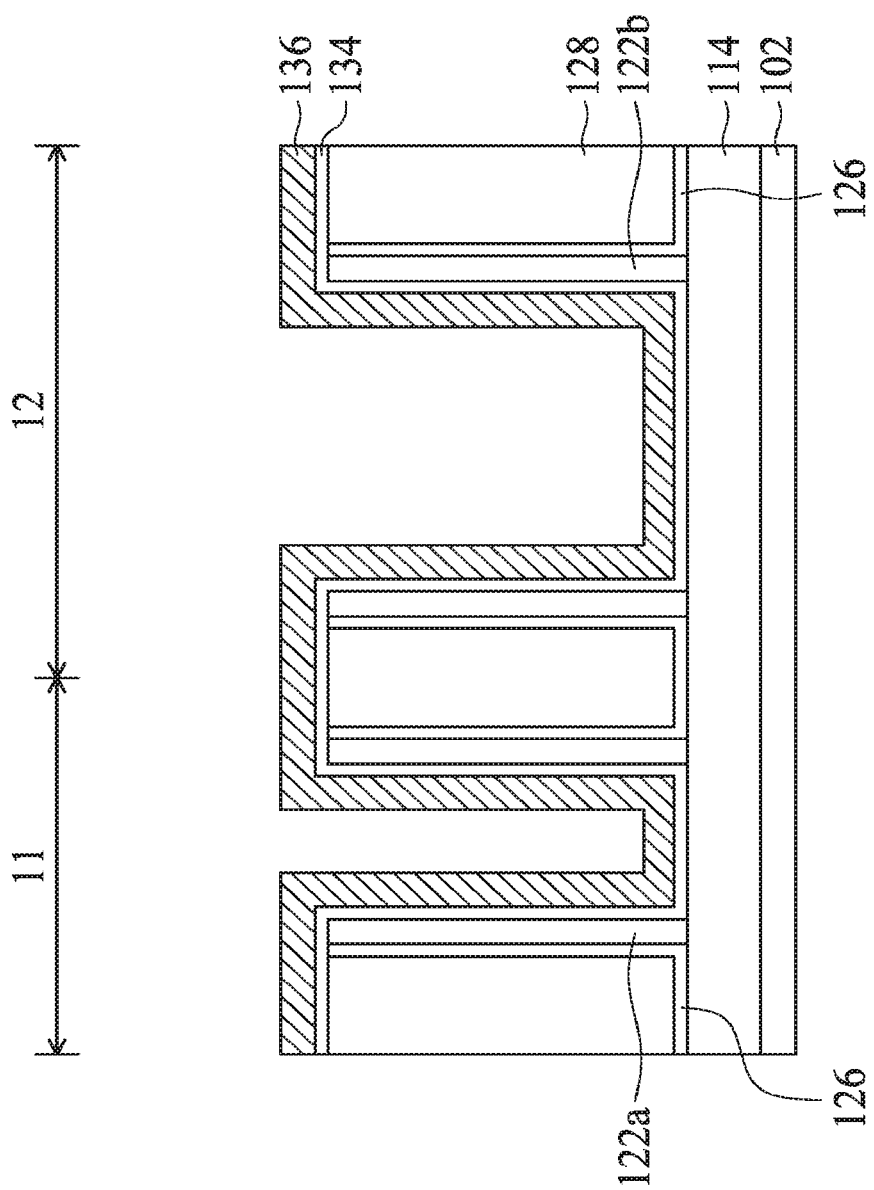

After the first trench 130a and the second trench 130b are formed, a gate dielectric layer 134 is conformally formed in the first trench 130a and the second trench 130b as shown in FIG. 2B, in accordance with some embodiments. More specifically, the gate dielectric layer 134 is formed over bottom surfaces and sidewalls of the first trench 130a and the second trench 130b, and over the inter-layer dielectric (ILD) structure 128.

The gate dielectric layer 134 may be a single layer or multiple layers. The gate dielectric layer 134 is made of silicon oxide ($SiO_x$), silicon nitride ($Si_xN_y$), silicon oxynitride (SiON), dielectric material(s) with low dielectric constant (low-k), or combinations thereof. In some embodiments, the gate dielectric layer 134 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the gate dielectric layer 134 is deposited by a plasma enhanced chemical vapor deposition (PECVD) process or by a spin coating process.

Afterwards, a work function layer 136 is formed over the gate dielectric layer 134. In some embodiments, the thickness of the work function layer 136 is greater than the thickness of the gate dielectric layer 134. The work function layer 136 is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

Figure 2C:
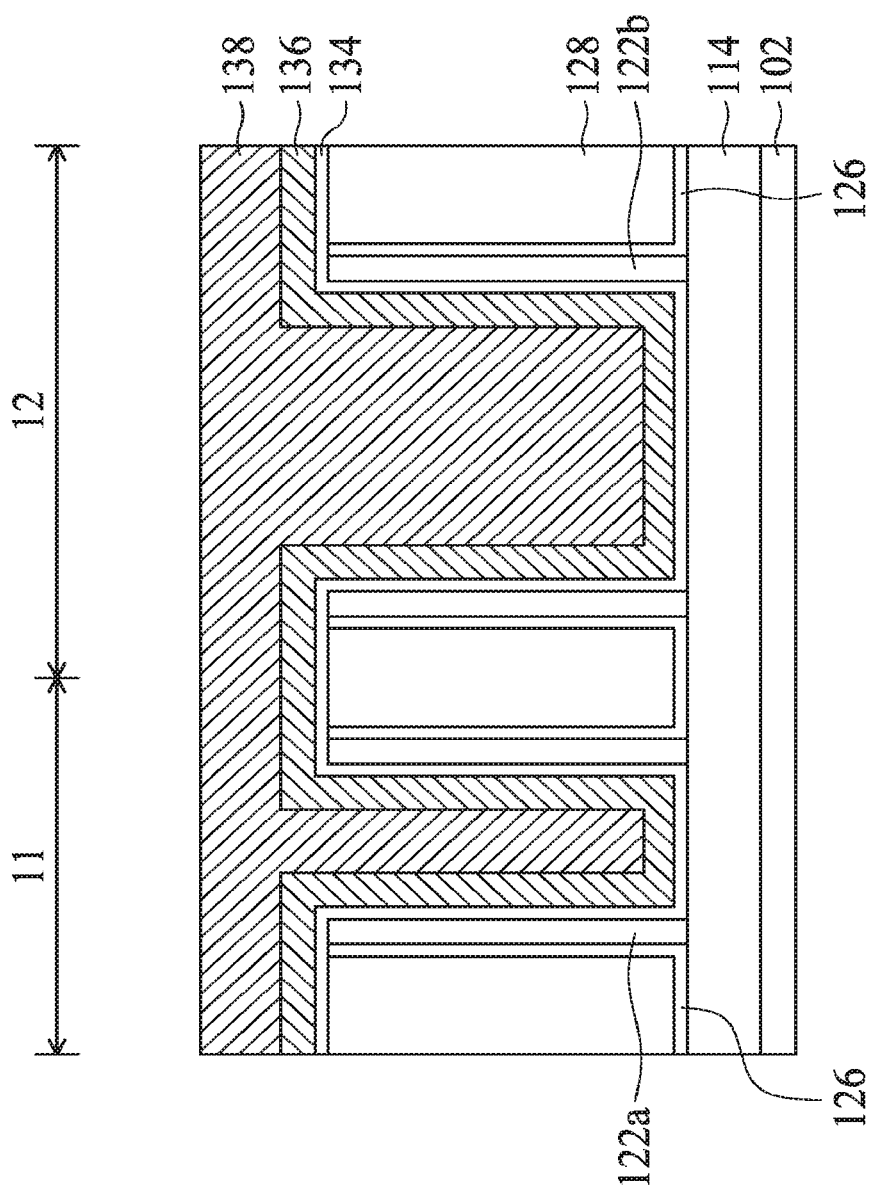

After the work function layer 136 is formed, a gate electrode layer 138 is formed over the work function layer 136 as shown in FIG. 2C, in accordance with some embodiments. The gate electrode layer 138 is made of conductive material, such as aluminum (Al), copper (Cu), tungsten (W), titanium (Ti), tantalum (Ta), or other applicable materials.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 2D:
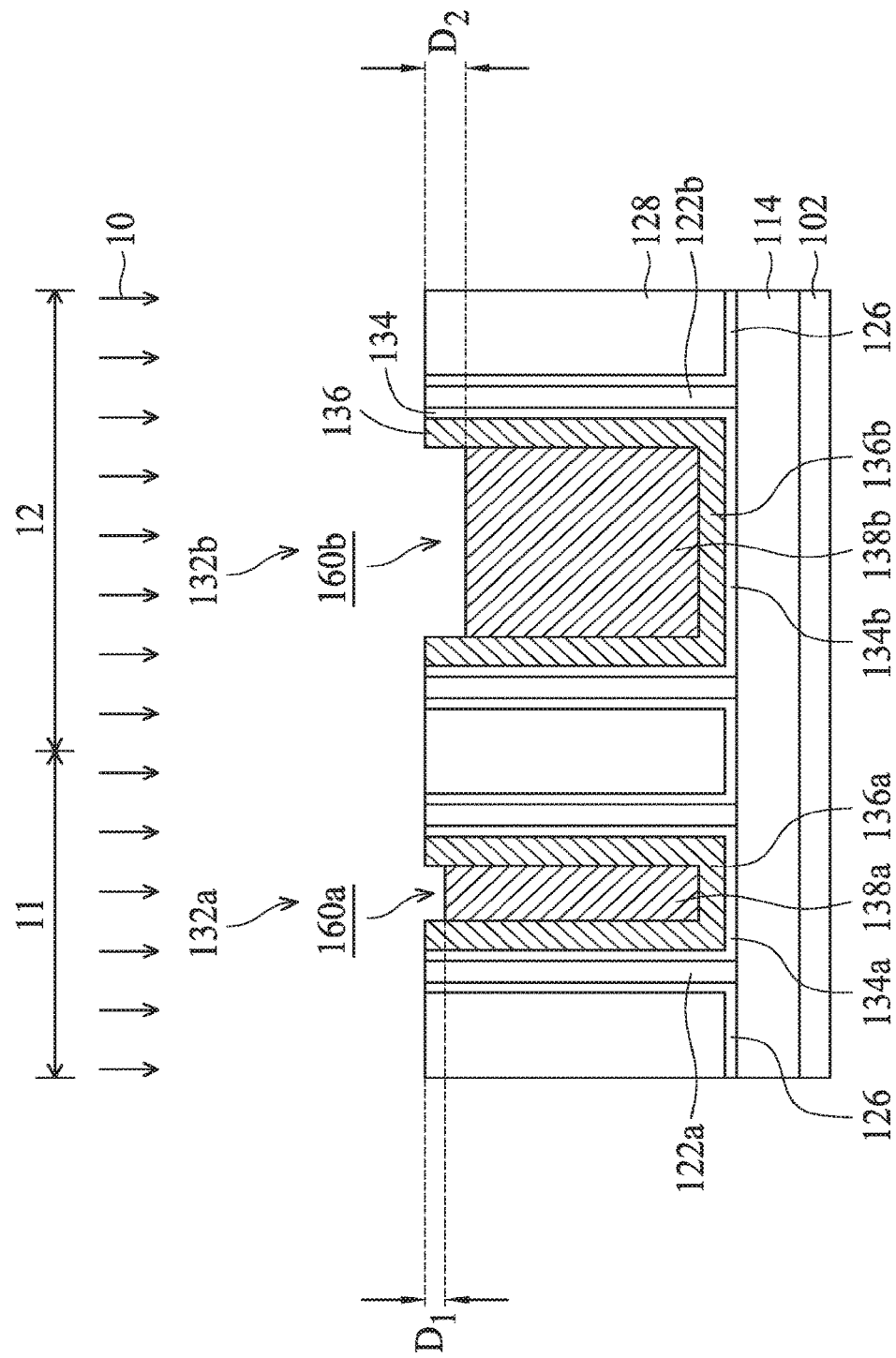

Afterwards, a portion of the gate dielectric layer 134, the work function layer 136 and the gate electrode layer 138 outside of the first trench 130a and the second trench 130b are removed by a removal process 11 as shown in FIG. 2D, in accordance with some embodiments. In some embodiments, the removal process 11 is a chemical mechanical polishing (CMP) process.

As a result, a first gate structure 132a in the first region 11 is constructed by a first gate dielectric layer 134a, a first work function layer 136a and a first gate electrode layer 138a formed in the first trench 130a. A second gate structure 132a in the second region 12 is constructed by a second gate dielectric layer 134b, a second work function layer 136b and a second gate electrode layer 138b formed in the second trench 130b. It should be noted that the area of the second gate electrode layer 138b in the second region 12 is larger than the area of the first gate electrode layer 138a in the first region 11.

The first gate structure 132a and the second gate structure 132b are transversely overlying a middle portion of the fin structure 110. A channel region is formed below the first gate structure 132a and the second gate structure 132b, and the channel region is wrapped by the first gate structure 132a and the second gate structure 132b.

It should be noted that the CMP process is performed on the first gate electrode layer 138a in the first region 11 and the second gate electrode layer 138b in the second region 12. The CMP process suffers an issue called "dishing effect". The dishing effect is generated when the CMP process is performed on the metal layer formed over trenches having different width. The surface of the metal layer is recessed in a dish shape in a wider opening. Therefore, in order to reduce the dishing effect between the first region 11 and the second region 12, an etching process is performed on the first gate electrode layer 138a and the second gate electrode layer 138b after the CMP process.

As a result, the first gate electrode layer 138a in the first region 11 is slightly recessed to form a first recess 160a, and the second gate electrode layer 138b in the second region 12 is recessed heavily to form a second recess 160b. The depth of the second recess 160b is greater than the depth of the first recess 160a.

In some embodiments, the first recess 160a has a first depth $D_1$ measured from a top surface of the first gate spacer 122a to a top surface of the first gate electrode layer 138a. In some embodiments, the second recess 160b has a second depth $D_2$ measured from a top surface of the second gate spacer 122a to a top surface of the second gate electrode layer 138b. The second depth $D_2$ is greater than the first depth $D_1$.

For regions with different exposed areas (or etched areas), it is difficult to control etch uniformity due to the loading effect. Depending on the etching strategy, the loading effect is the etch rate for a larger area being either faster or slower than it is for a smaller area. In other words, the loading effect is that the etch rate in large area is mismatched the etch rate in small area. This means that the loading effect may be affected by the pattern density. Therefore, while etching the first work function layer 136a in a first region 11 and the second work function layer 136b in a second region 12, it is more difficult to control the uniformity of the etch depth.

In addition, as mentioned above, a top surface of the second gate electrode 138b is lower than a top surface of the first gate electrode 138a after the removal process 11. More specifically, more area of the second work function layer 136b is exposed than the first work function layer 136a because the removed portion of the second etched gate electrode layer 138'b is greater than that of the first etched gate electrode layer 138'a. Therefore, after the second etching process, the etched depth of the second work function layer 136b may be more than the etched depth of the first work function layer 136a due to the loading effect.

If more than a predetermined amount of the second work function layer 136b in the second region 12 is removed, the breakdown voltage (Vbd) of the second gate structure 132b may undesirably decrease. More specifically, if too much of the second work function layer 136b is removed, the second work function layer 136b may touch a top surface of the fin structure 110, the function of the second gate structure 132b may fail. On the other hand, if less than the predetermined amount of the first work function layer 136a in the first region 11 is removed, a gate-to-drain capacitance (Cgd) of the first gate structure 1 32a may undesirably increase.

In order to resolve the above problems, a second etching process including a first plasma operation 13a and a second plasma operation 13b is performed. After the removal process 11, the second etching process is used to remove a portion of the first work function layer 136a and a portion of the second work function layer 136b.

Figure 2E:
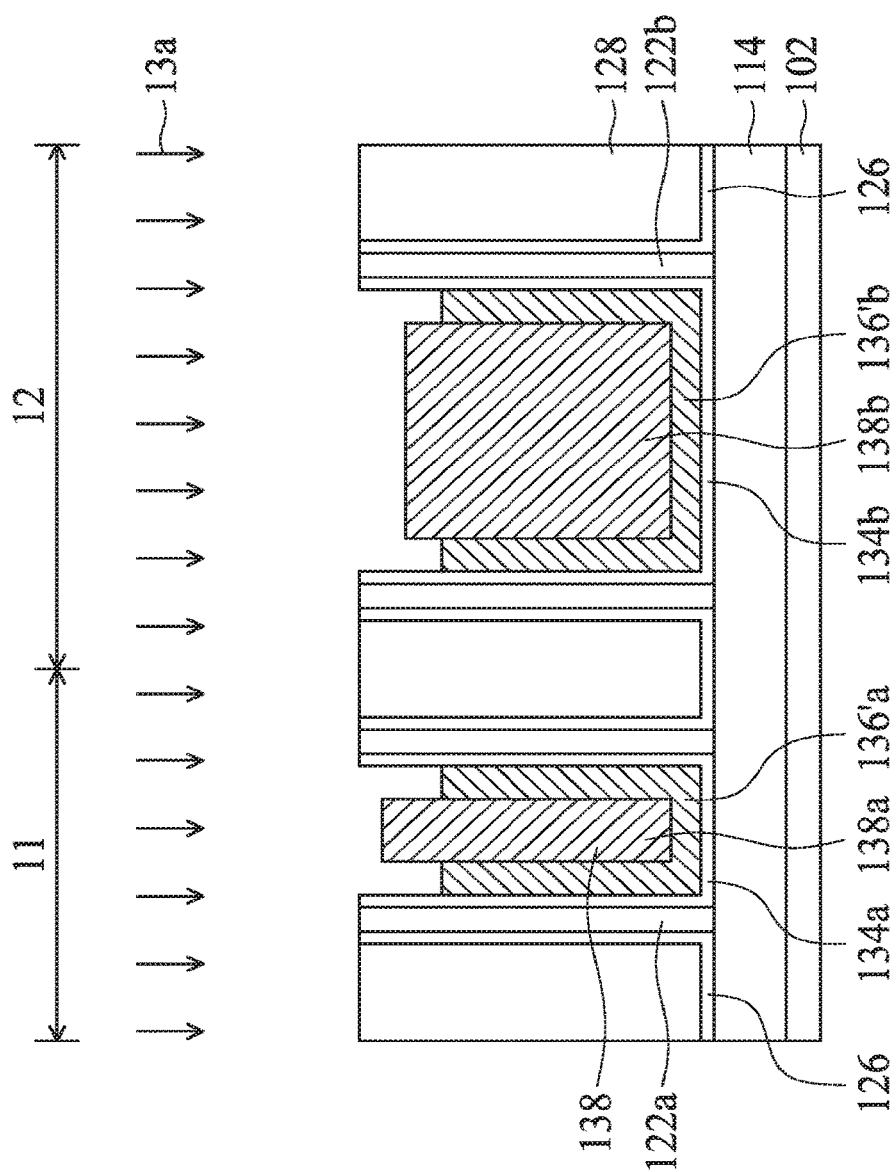
Figure 2F:
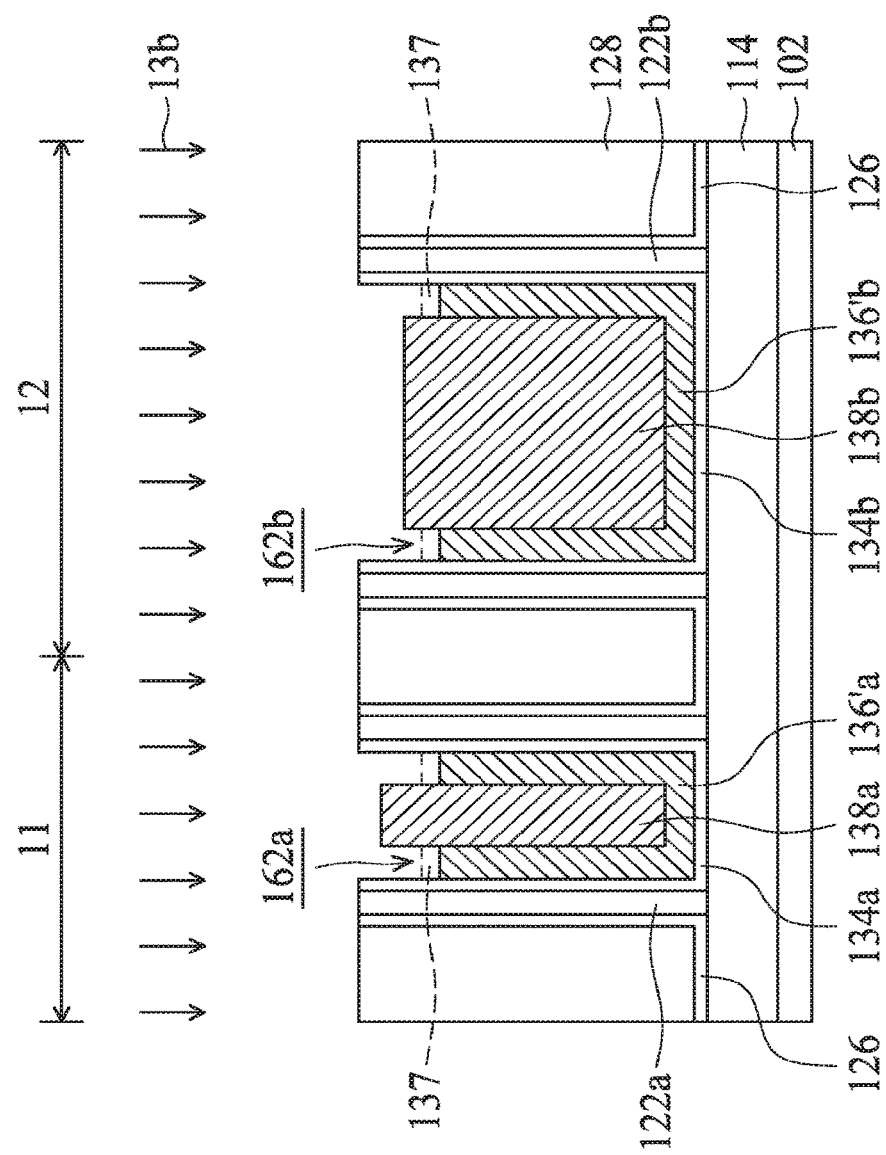

The second etching process includes the first plasma operation 13a as shown in FIG. 2E and the second plasma operation 13b as shown in FIG. 2F, in accordance with some embodiments. The first plasma operation 13a is configured to etch a portion of the first work function layer 136a and a portion of the second work function layer 136b, and the second plasma operation 13a is configured to form a protection film 137 on the first work function layer 136a and the second work function layer 136b.

In some embodiments, the second etching process is operated at a temperature in a range from about 60 degrees to about 100 degrees. If the temperature is lower than 60 degrees, the etching rate may be too low, and more etching time is needed. Thus, the fabrication cost may increase. If the temperature is higher than 100 degrees, the etching rate may be too high. Thus, the etching amount is difficult to control and over-etching may occur.

In some embodiments, the second etching process is operated at a pressure in a range from about 1 mtorr to about 10 mtorr. If the pressure of the second etching process is lower than 1 mtorr, the etching rate is too low. If the pressure of the second etching process is higher than 80 mtorr, the etching uniformity is poor.

In some embodiments, the first plasma operation 13a is performed by using a first plasma includes boron chloride ($BCl_3$), chlorine gas ($Cl_2$), oxygen ($O_2$) or combinations thereof. In some embodiments, the first plasma operation 13a is performed at a power in a range from about 100 W to about 500 W. If the power is smaller than 100 W, the etching rate may be too low. If the power is greater than 500 W, the etching rate may be too fast, and the critical dimension (CD) is difficult to control.

After the first plasma operation 13a is performed, the second plasma operation 13b is performed on the first work function layer 136a and the second work function layer 136b as shown in FIG. 2F, in accordance with some embodiments. It should be noted that the first plasma operation 13a and the second plasma operation 13b are performed in the same chamber without transferring to another chamber, such that the pollution is reduced.

It should be noted that during the second plasma operation 13b, the protection film 137 may temporarily form over the first work function layer 136a and the second work function layer 136b. The protection film 137 is used to prevent the second work function layer 136b from being etched too much due to the loading effect.

In some embodiments, the second plasma operation 13b is performed by using a second plasma comprising chlorine gas ($Cl_2$), hydrogen bromide (HBr), or combinations thereof. In some embodiments, the second plasma operation 13b is performed at zero power. During the second plasma operation 13b, the main function of the second plasma is to perform a deposition operation. The main function of the first plasma is to perform an etching operation.

When the bias power of the second plasma operation 13b is set at zero, the gas generated from the second plasma may react with each other to form a polymer over the first work function layer 136a and the second work function layer 136b. The temporary polymer is used as a protection layer to prevent the second work function layer 136b from being etched too much. Therefore, the loading effect between the first work function layer 136a and the second work function layer 136b is reduced.

Figure 3:
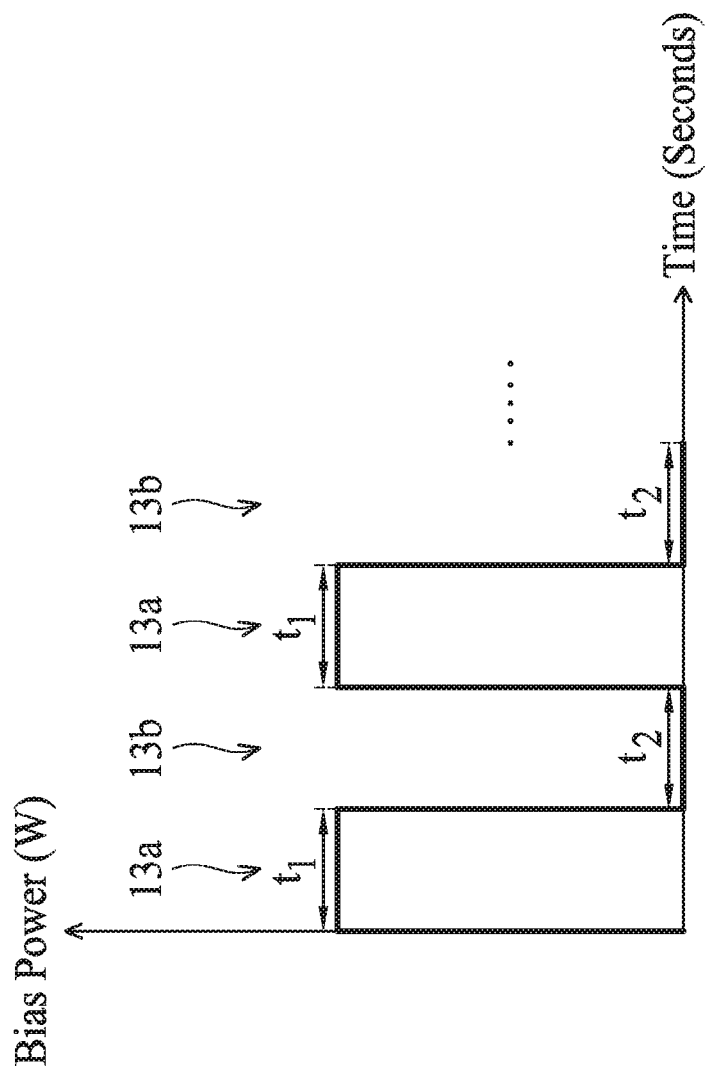
FIG. 3 shows a bias power (W) versus an operation time (seconds) of a first plasma operation and a second plasma operation, in accordance with some embodiments.

FIG. 3 shows a bias power (W) versus an operation time (second) of the first plasma operation 13a and the second plasma operation 13b, in accordance with some embodiments. The first plasma operation 13a is operated for a period of time t1, and the second plasma operation 13b is operated for a period of time t2. In some embodiments, a ratio of the first period of time to the second period of time is in a range from about 1/4 to about 4/1. If the ratio is not within the above range, the loading effect may be serious.

It should be noted that the first plasma operation 13a is operated at a bias power in a range from about 100 W to about 500 W, but the second plasma operation 13b is operated at zero power. No etching operation is performed when the power is at zero value. Therefore, the loading effect may be reduced by performing the second plasma operation 13b after the first plasma operation 13a.

Figure 2G:
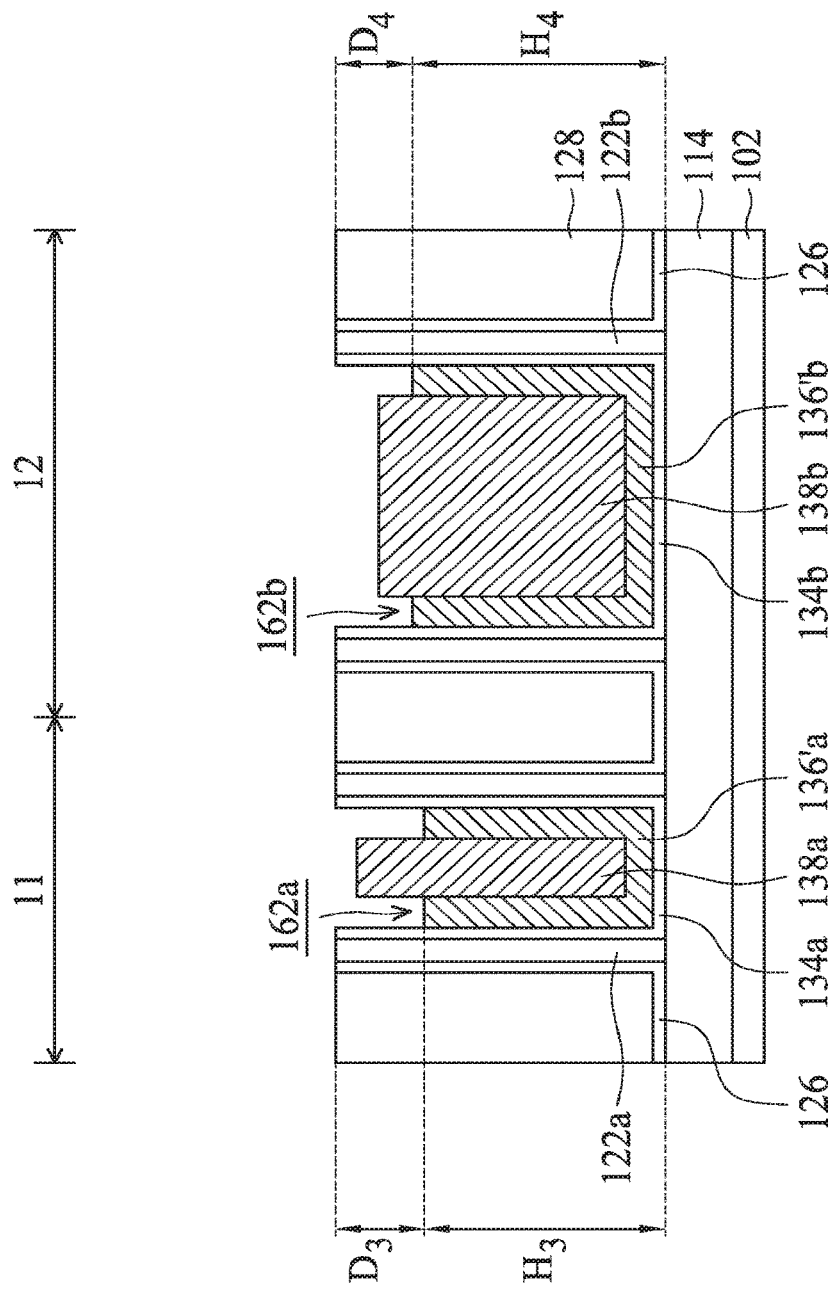

After the second plasma operation 13b, the first etched work function layer 136'a and the second etched work function layer 136'b are obtained as shown in FIG. 2G, in accordance with some embodiments. In addition, a first via 162a is formed over the first etched work function layer 136'a, and a second via 162b is formed over the second etched work function layer 136'b.

In some embodiments, the first etched work function layer 136'a has a third height $H_3$ which is measured from a top surface of the isolation structure 114 to a top surface of the first etched work function layer 136'a. In some embodiments, the second etched work function layer 136'b has a fourth height $H_4$ which is measured from a top surface of the isolation structure 114 to a top surface of the second etched work function layer 136'b. In some embodiments, the third height $H_3$ is higher than the fourth height $H_4$. In some embodiments, a gap ΔH between the third height $H_3$ and the fourth height $H_4$ is in a range from about 1 nm to about 6 nm. In some embodiments, a gap ΔH between the third height $H_3$ and the fourth height H4 is in a range from about 2 nm to about 4 nm.

In some embodiments, the first via 162a has a third depth $D_3$ which is measured from a top surface of the first gate spacers 122a to a top surface of the first etched work function layer 136'a. In some embodiments, the second via 162b has a fourth depth $D_4$ which is measured from a top surface of the second gate spacers 122b to a top surface of the second etched work function layer 136'b. In some embodiments, the third depth $D_3$ is greater than the fourth depth $D_4$. In some embodiments, a gap ΔH between the third depth $D_3$ and the fourth depth $D_4$ is in a range from about 1 nm to about 6 nm. In some embodiments, a gap ΔH between the third depth $D_3$ and the fourth depth $D_4$ is in a range from about 2 nm to about 4 nm.

After the second plasma operation 13b and before a third etching process (as shown in FIG. 2G), the first plasma operation 13a and the second plasma operation 13b may be repeated until the gap ΔH between the first etched work function layer 136'a and the second etched work function layer 136'b reaches the predetermined value. One cycle includes performing the first plasma operation 13a and the second plasma operation 13b. In some embodiments, the cycle time is in a range from 0 to 10.

Figure 2H:
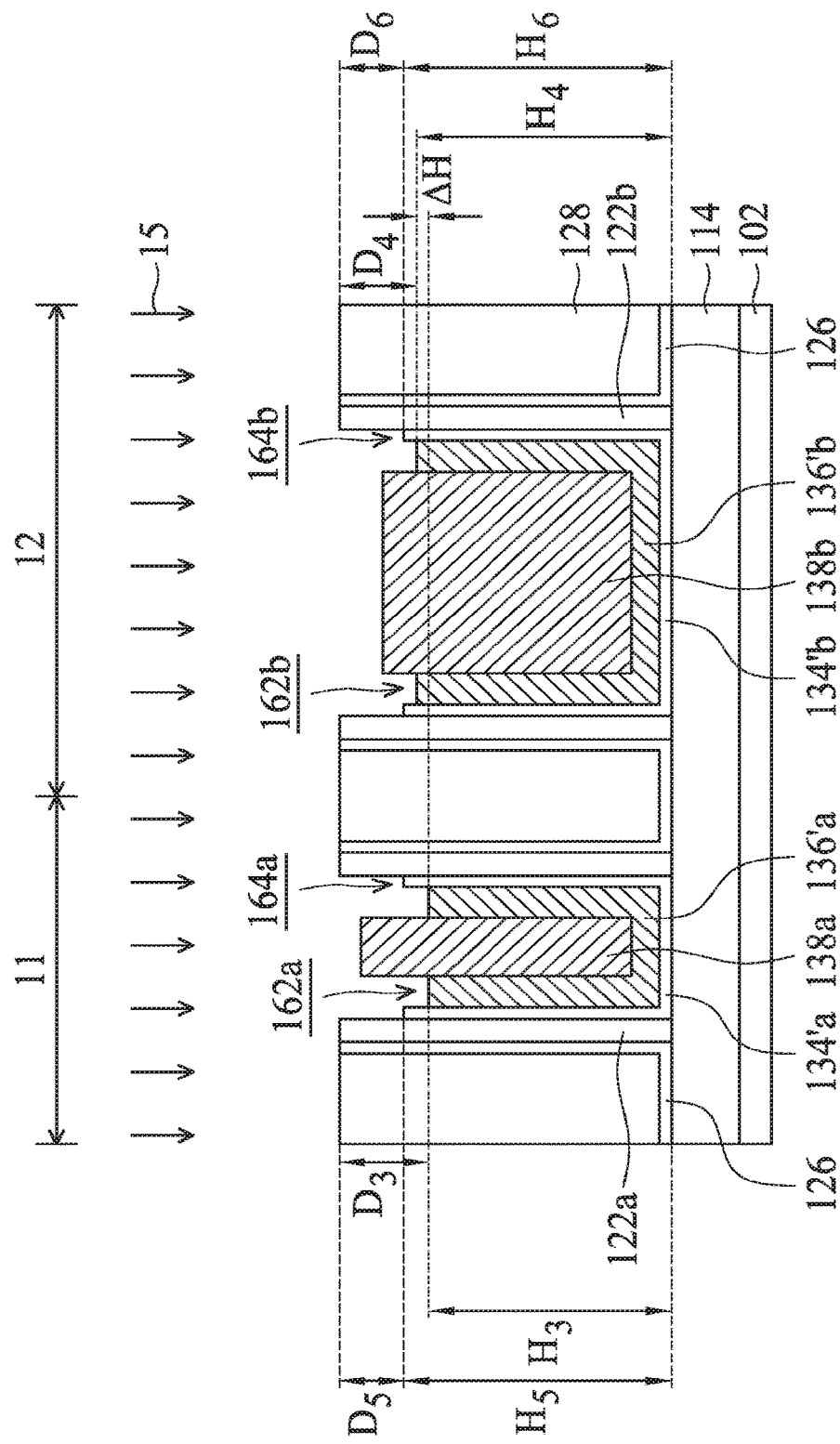

After the second etching process including the first operation 13a and the second operation 13b, a third etching process 15 is performed on the first gate dielectric layer 134a in the first region 11 and the second gate dielectric layer 134b in the second region 12 as shown in FIG. 2H, in accordance with some embodiments.

As a result, the first etched gate dielectric layer 134'a and the second etched gate dielectric layer 134'b are obtained after the third etching process 15. In some embodiments, the first etched gate dielectric layer 134'a has a fifth height $H_5$, and the second etched gate dielectric layer 134'b has a sixth height $H_6$. In some embodiments, the fifth height $H_5$ is equal to the sixth height $H_6$. The fifth height $H_5$ of the first etched gate dielectric layer 134'a is higher than the third height $H_3$ of the first etched work function layer 136'a. The sixth height $H_6$ of the second etched gate dielectric layer 134'b is higher than the fourth height $H_4$ of the second etched work function layer 136'b.

In addition, a top portion of the first gate dielectric layer 134a is removed to form a first hole 164a in the first region 11, and a top portion of the second gate dielectric layer 134b is removed to form a second hole 164b in the second region 12. In some embodiments, the first hole 164a has a fifth depth $D_5$, and the second hole 164b has a sixth depth $D_6$. In some embodiments, the fifth depth $D_5$ is equal to the sixth depth $D_6$.

Figure 2I:
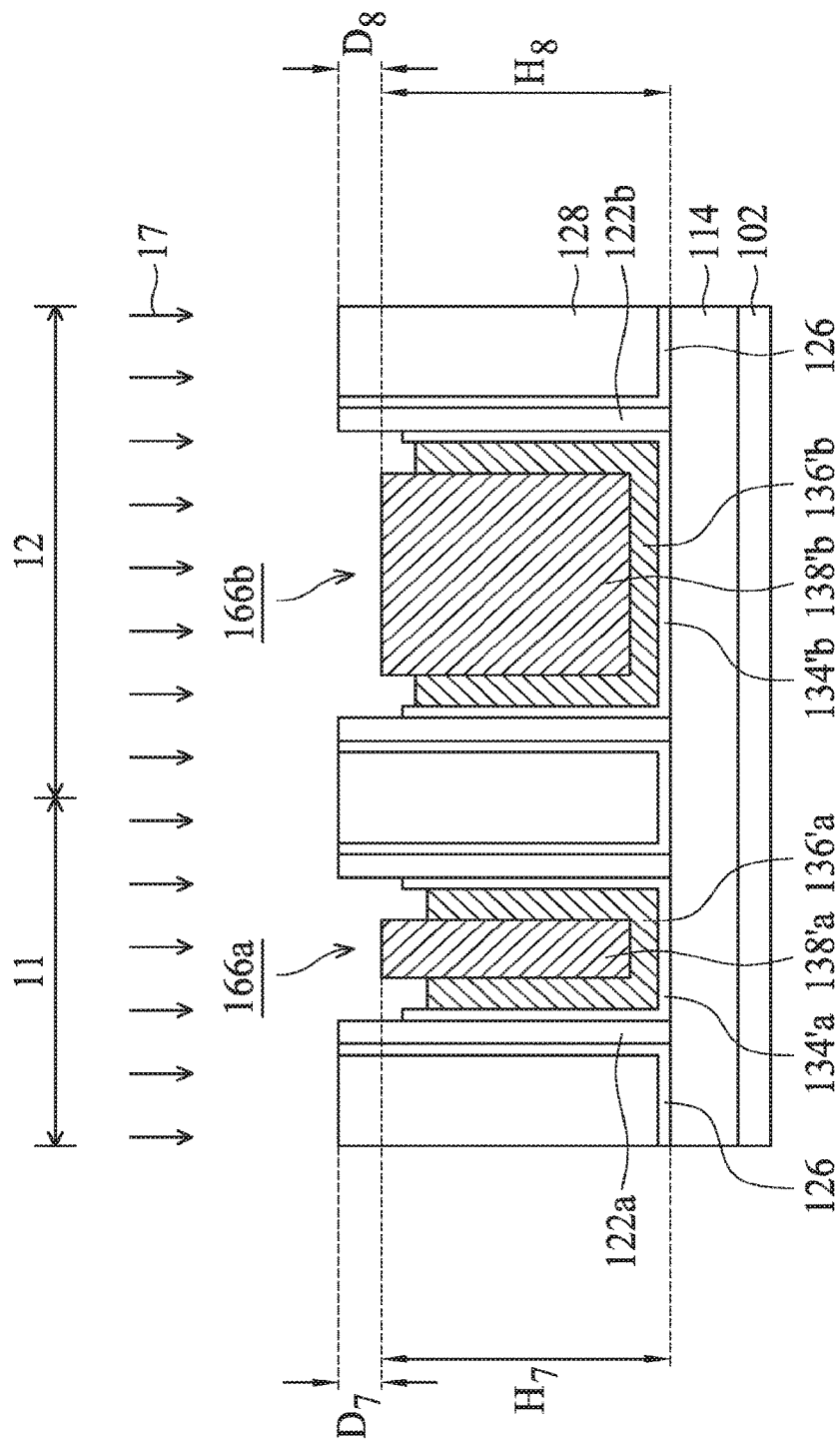

After the third etching process 15, a fourth etching process 17 is performed on the first gate electrode layer 138a and the second gate electrode layer 138b as shown in FIG. 2I, in accordance with some embodiments. As a result, the first etched gate electrode layer 138'a and the second etched gate electrode layer 138'b are obtained. In some embodiments, the first etched gate electrode layer 138'a has a seventh height $H_7$, and the second etched gate electrode layer 138'b has an eighth height $H_8$. The seventh height $H_7$ is substantially equal to the eighth height $H_8$. The seventh height $H_7$ is higher than the fifth height $H_5$ of the first etched gate dielectric layer 134'a. The eighth height $H_8$ is higher than the sixth height $H_6$ of the second etched gate dielectric layer 134'b.

In addition, a top portion of the first gate electrode layer 138 is removed to form a first cavity 166a in the first region 11, and a top portion of the second gate electrode layer 138b is removed to form a second cavity 166b in the second region 12. In some embodiments, the first cavity 166a has a seventh depth $D_7$ and the second cavity 166b has an eighth depth $D_8$. The seventh depth $D_7$ is equal to the eighth depth $D_8$.

Figure 2J:
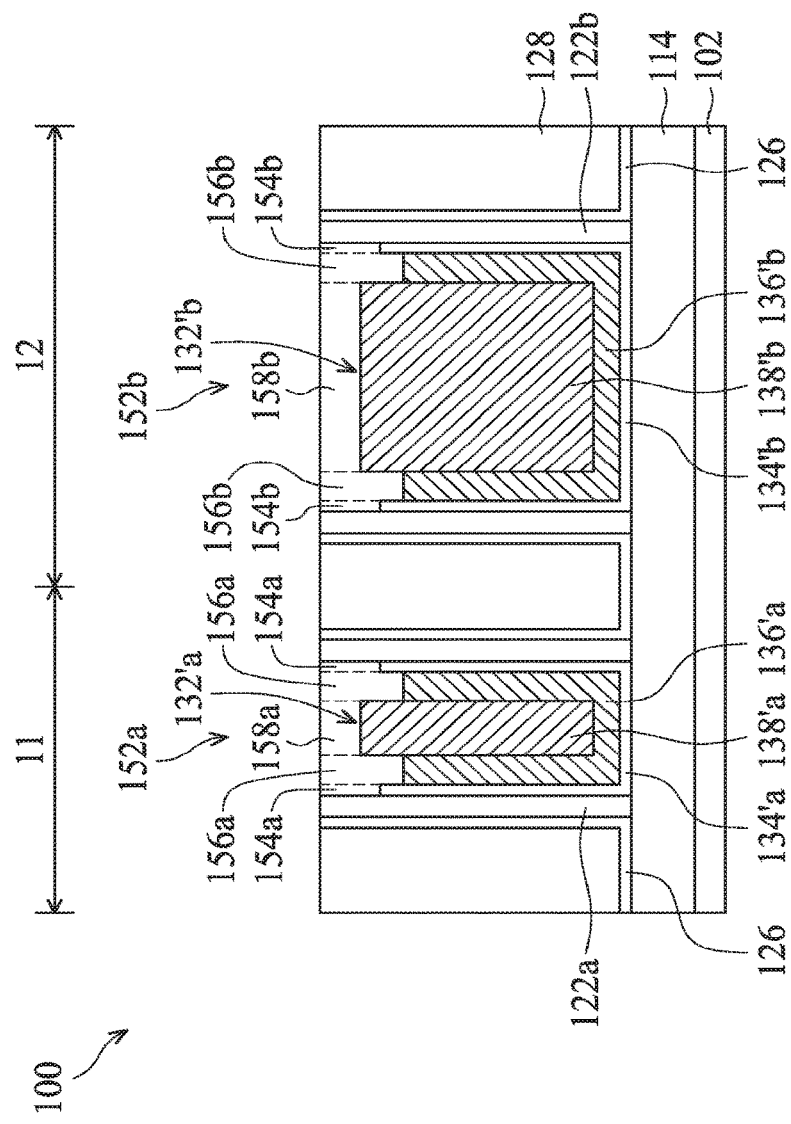

After the fourth etching process 17, a first hard mask layer 152a is formed on the etched gate structure 132'a, and a second hard mask layer 152b is formed on the etched gate structure 132'b as shown in FIG. 2J, in accordance with some embodiments. The first hard mask layer 152a has an uneven bottom surface and the second hard mask layer 152a has an uneven bottom surface.

The first hard mask structure 152a includes a first portion 154a over the first etched gate dielectric layer 134'a, a second portion 156a over the first etched work function layer 136'a and a third portion 158a over the first etched gate electrode layer 138'a. The second hard mask structure 152b includes a first portion 154b over the second etched gate dielectric layer 134'b, a second portion 156b over the second etched work function layer 136'b and a third portion 158b over the second etched gate electrode layer 138'b.

In some embodiments, the first hard mask structure 152a is formed by filling the first via 162a, the first hole 164a, and the first cavity 166a with a dielectric material. The second hard mask structure 152b is formed by filling the second via 162b, the second hole 164b, and the second cavity1 66b with a dielectric material.

In some embodiments, the hard mask structures 152a, 152b are made of silicon nitride. The hard mask structures 152a, 152b may be formed by using low-pressure chemical vapor deposition (LPCVD) or plasma enhanced chemical vapor deposition (PECVD), although other deposition processes may also be used in some other embodiments.

Figure 4:
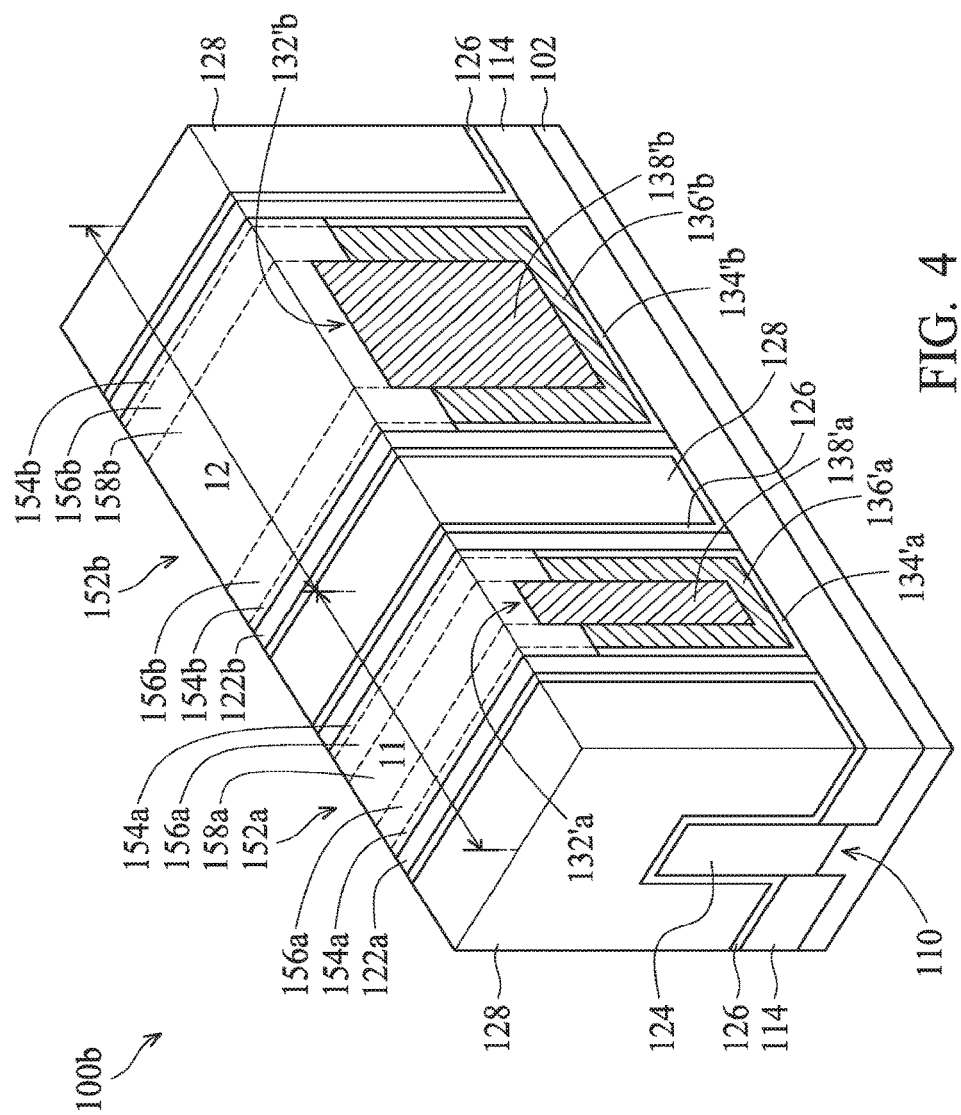
FIG. 4 shows a perspective representation of a FinFET device structure, in accordance with some embodiments of the disclosure.

FIG. 4 shows a perspective representation of a FinFET device structure 100b, in accordance with some embodiments of the disclosure. Semiconductor structure 100b is similar to, or the same as, semiconductor structure 100 shown in FIGS. 1H and 2J, except the top surfaces of the first etched gate dielectric layer 134'a and the first etched work function metal layer 136'a are level. Processes and materials used to form semiconductor structure 100b may be similar to, or the same as, those used to form semiconductor structure 100 and are not repeated herein.

As shown in FIG. 4, the top surface of the first etched gate electrode layer 138'a is higher than the top surface of the first etched work function layer 136'a, and the top surface of the second etched gate electrode layer 138'b is higher than the top surface of the second etched work function layer 136'b.

FIGS. 5A-5E show a perspective representations of various stages of forming a FinFET device structure 100a, in accordance with some embodiments of the disclosure.

Figure 5A:
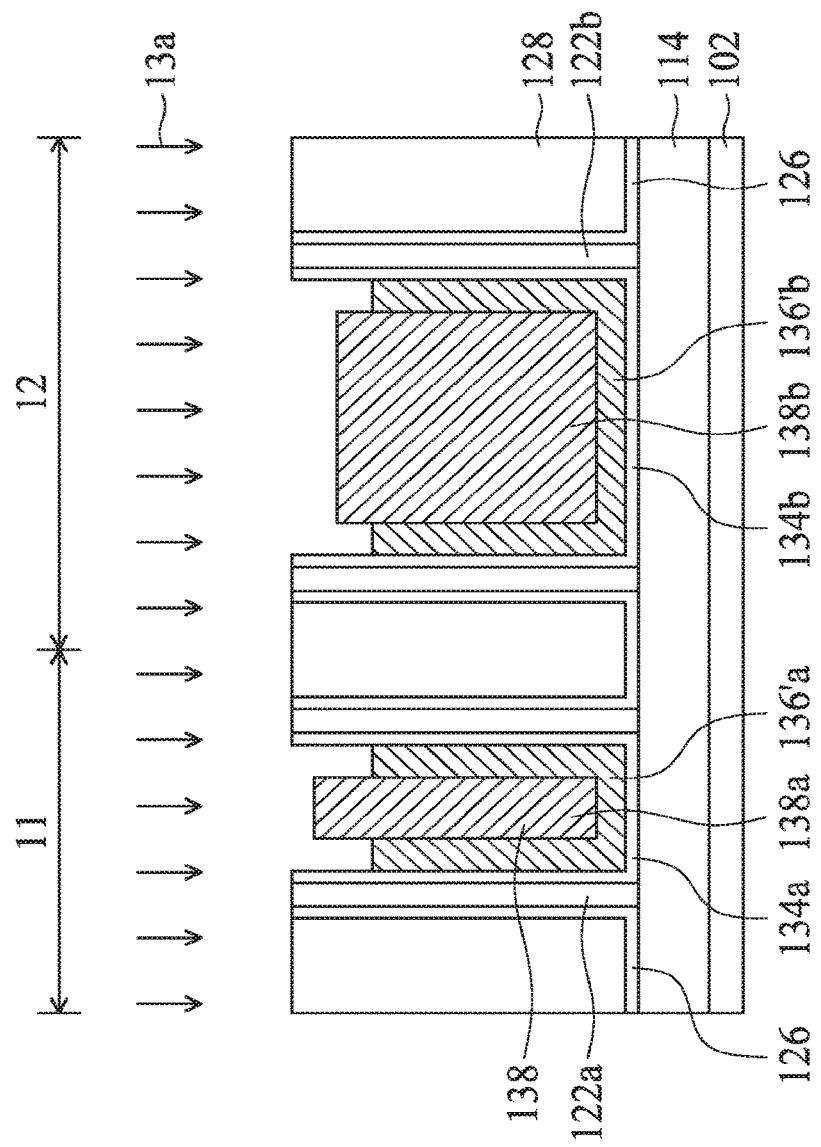
FIGS. 5A-5E show a perspective representations of various stages of forming a FinFET device structure, in accordance with some embodiments of the disclosure.

Referring to FIG. 5A, the first plasma operation 13a is performed on the first work function layer 136a and the second work function layer 136b.

Figure 5B:
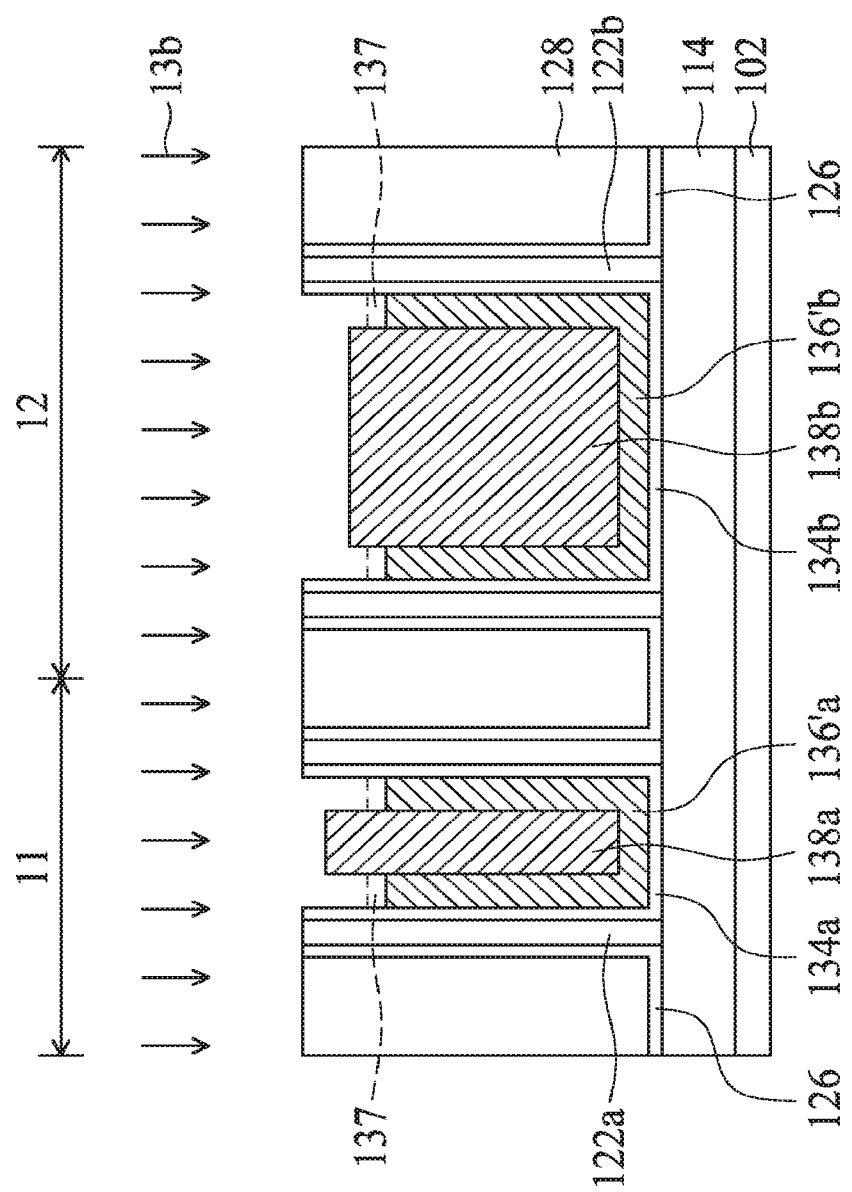

After the first plasma operation 13a, the second plasma operation 13b is performed as shown in FIG. 5B, in accordance with some embodiments of the disclosure. The protection films 137 are temporarily formed on the first work function layer 136a and the second work function layer 136b. The main function of the protection films 137 is to be used as protection to prevent the second work function layer 136b being etched too much.

After the second plasma operation 13b, a second cycle including the first plasma operation 13a and the second plasma operation 13b may be performed again. The loading effect may be gradually reduced by repeating the cycle. The time of the cycle may be adjusted according to the actual application.

Figure 5C:
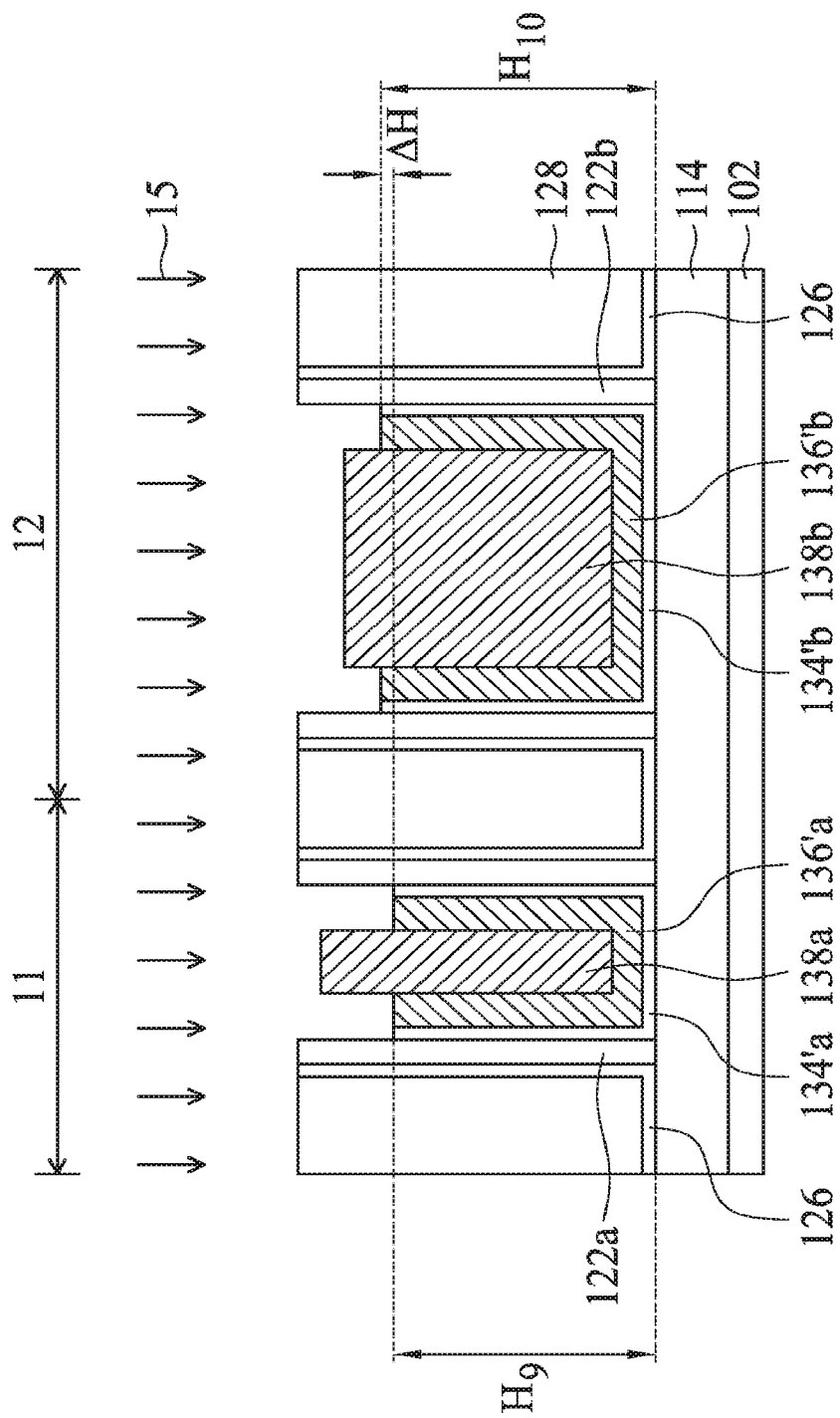

Afterwards, top portions of the first gate dielectric layer 134a and the second gate dielectric layer 134b are removed by the third etching process 15 as shown in FIG. 5C, in accordance with some embodiments of the disclosure.

The first etched work function layer 136'a has a ninth height $H_9$, and the second etched work function layer 136'b has a tenth height $H_{10}$. The ninth height $H_9$ is smaller than the tenth height $H_{10}$. In some embodiments, a gap $\Delta H$ between the ninth height $H_9$ and the tenth height $H_{10}$ is in a range from about 1 nm to about 6 nm. In some embodiments, a gap $\Delta H$ between the ninth height $H_9$ and the tenth height $H_{10}$ is in a range from about 2 nm to about 4 nm. The first etched work function layer 136'a is level with the first etched gate dielectric layer 134'a.

Figure 5D:
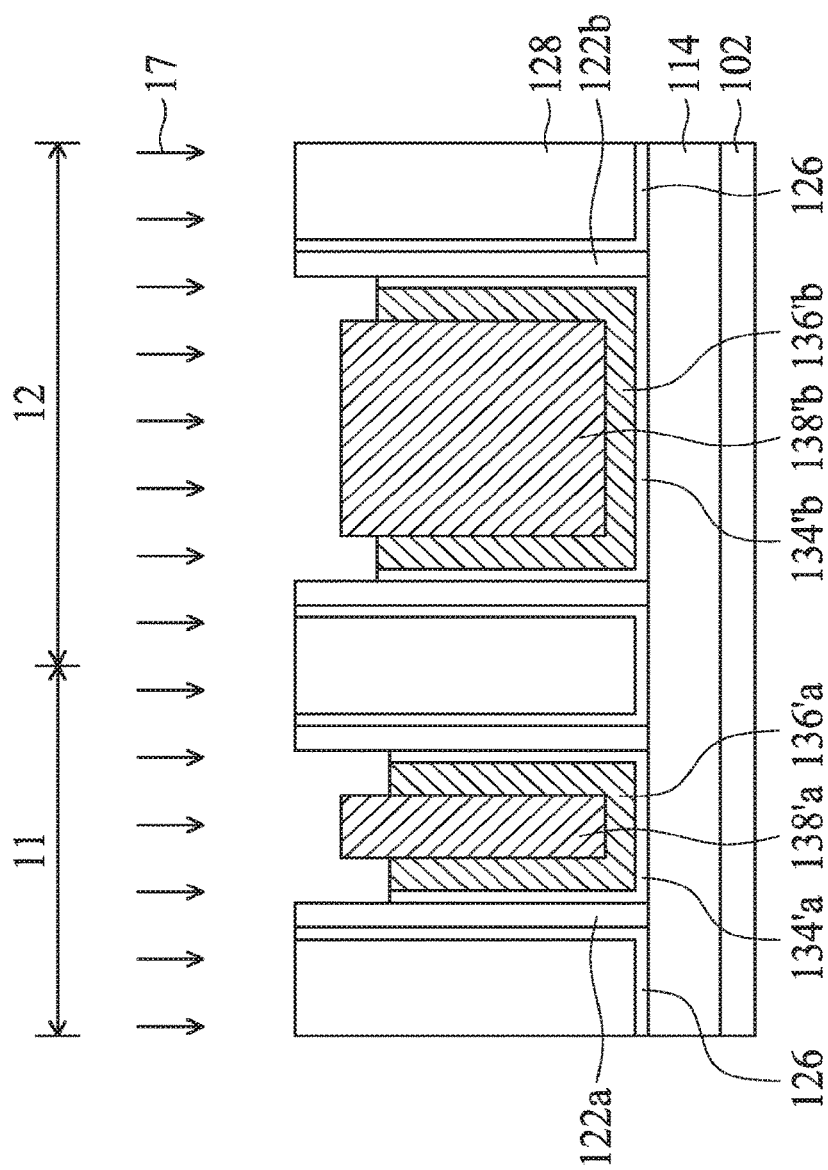

After the third etching process 15, the fourth etching process 17 is performed to remove top portions of the first gate electrode layer 138a and the second gate electrode layer 138b as shown in FIG. 5D, in accordance with some embodiments of the disclosure.

Figure 5E:
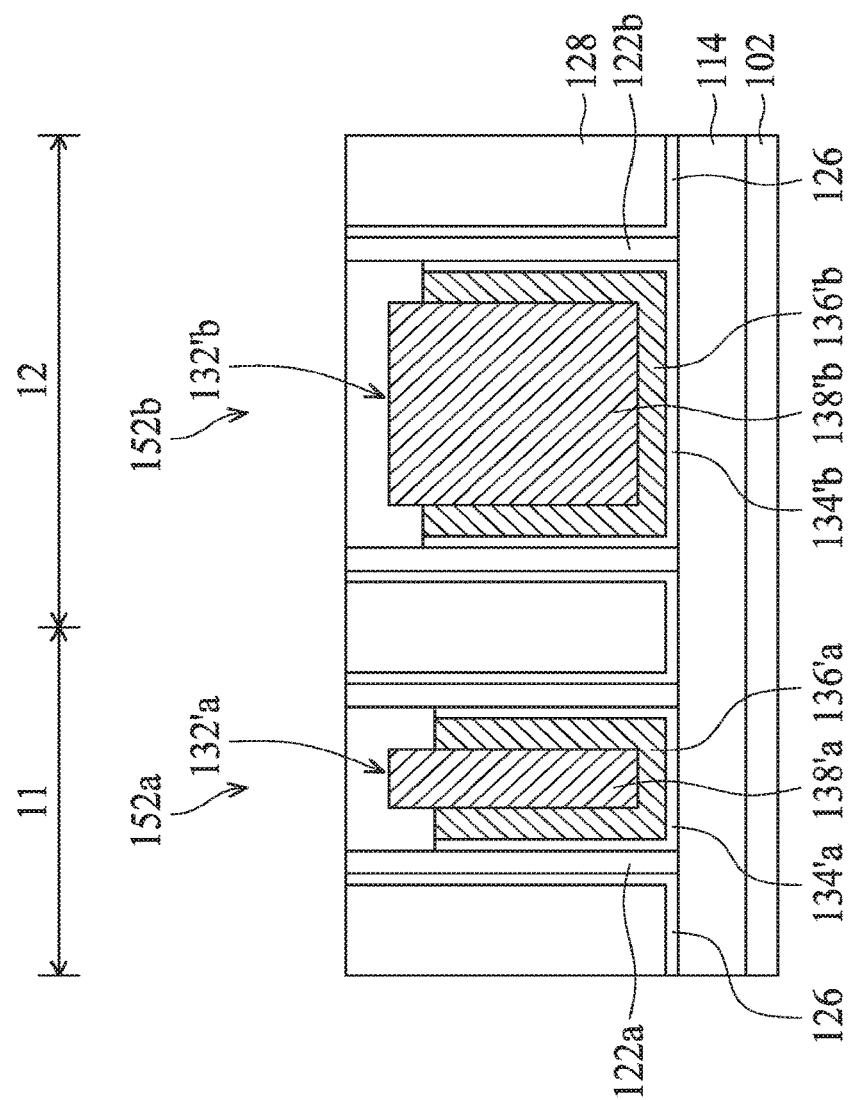

After the fourth etching process 17, the first hard mask layer 152a and the second hard mask layer 152b are formed over the uneven surface of the first etched gate structure 132'a and the second etched gate structure 132'b as shown in FIG. 5E, in accordance with some embodiments of the disclosure.

When the loading effect between the first region 11 and the second region 12 is reduced, the third height $H_3$ (shown in FIG. 2G) of the first etched work function layer 136'a is lower than the fourth height $H_4$ of the second etched work function layer 136'b. Therefore, the gate-to-drain capacitance (Cgd) of the first gate structure 132a is decreased, and the breakdown voltage (Vbd) of the second gate structure 132b is increased. In addition, the first plasma operation and the second plasma operation is performed in-situ without transfer to different chamber.

Embodiments for forming a semiconductor device structure and method for formation the same are provided. A FinFET structure includes a first gate structure and a second gate structure formed over a fin structure over a substrate. The gate structure includes a gate dielectric layer, a work function layer and a gate electrode layer. The area of the second gate structure is greater than that of the first gate structure. In order to reduce the loading effect between two gate structures, when the work function layer is etched, a first plasma operation and a second plasma operation are sequentially performed on the work function layer. The bias power of the second plasma operation is set at zero value. Therefore, the gate-to-drain capacitance (Cgd) of the first gate structure is decreased, and the breakdown voltage (Vbd) of the second gate structure is increased. As a result, the performance of the FinFET device structure is improved.

In some embodiments, a FinFET device structure is provided. The FinFET device structure includes an isolation structure formed over a substrate and a fin structure formed over the substrate. The FinFET device structure includes a first gate structure and a second gate structure formed over the fin structure, and the first gate structure has a first width in a direction parallel to the fin structure, the second gate structure has a second width in a direction parallel to the fin structure, and the first width is smaller than the second width. The first gate structure includes a first work function layer having a first height which is measured from a top surface of the isolation structure to a top surface of the first gate structure. The second gate structure includes a second work function layer having a second height which is measured from a top surface of the isolation structure to a top surface of the second gate structure and a gap between the first height and the second height is in a range from about 1 nm to about 6 nm.

In some embodiments, a method for forming a FinFET device structure is provided. The method includes forming a fin structure over a substrate, and the substrate comprises a first region and a second region. The method includes forming a first dummy gate structure and a second dummy gate structure over the fin structure and forming an inter-layer dielectric (ILD) structure over the substrate and adjacent to the first dummy gate structure and the second dummy gate structure. The method also includes removing the first dummy gate structure and the second dummy gate structure to form a first trench and a second trench in the ILD structure and forming a first gate structure in the first trench and a second gate structure in the second trench. The first gate structure includes a first work function layer, and the second gate structure includes a second work function layer. The method further includes performing a first plasma operation on the first work function layer and the second work function layer for a first period of time and performing a second plasma operation on the first work function layer and the second work function layer for a second period of time. The first work function layer has a first height, and the second work function layer has a second height, and a gap between the first height and the second height is in a range from about 1 nm to about 6 nm.

In some embodiments, a method for forming a semiconductor device structure is provided. The method includes forming a fin structure over a substrate and forming a first dummy gate structure and a second dummy gate structure over the fin structure. The method also includes forming an inter-layer dielectric (ILD) structure over the substrate and adjacent to the dummy gate structure and removing the first dummy gate structure and the second dummy gate structure to form a first trench and a second trench in the ILD structure. The method also includes forming a first work function layer in the first trench and a second work function layer in the second trench and forming a first gate electrode layer over the first work function layer and a second gate electrode layer over the second work function layer. The method further includes removing a portion of the first work function layer and a portion of the second work function layer by an etching process. The etching process includes a first plasma operation and a second plasma operation, and the second plasma operation is performed at zero bias power.

One general aspect includes a fin field effect transistor (FINFET) device structure, including: an isolation structure formed over a substrate; a fin structure formed over the substrate; and a first gate structure and a second gate structure formed over the fin structure, where the first gate structure has a first width in a direction parallel to the fin structure, the second gate structure has a second width in a direction parallel to the fin structure, and the first width is smaller than the second width, and where the first gate structure includes a first work function layer and a gate electrode surrounded by the first work function layer and a step between a topmost surface of the gate electrode and a topmost surface of the first work function layer, the first work function layer having a first height which is measured from a top surface of the isolation structure to a top surface of the first gate structure; and the second gate structure includes a second work function layer and a second gate electrode surrounded by the second work function layer and a step between a topmost surface of the second gate electrode and a topmost surface of the second work function layer, the second work function layer having a second height which is measured from a top surface of the isolation structure to a top surface of the second gate structure.

Another general aspect includes a device including: a fin extending from a semiconductor substrate, the fin having a longitudinal axis in a first direction; a first gate stack extending over the fin and having a longitudinal axis orthogonal to the first direction, the first gate stack having a first width in the first direction and including a first gate dielectric layer having outermost sidewalls spaced apart by the first width, a first work function layer having outermost sidewalls spaced apart by a second width in the first direction less than the first width and having innermost sidewalls spaced apart by a third width in the first direction less than the second width, and a first gate electrode having outermost sidewalls spaced apart by the third width, where a topmost surface of the first gate electrode forms a step with a topmost surface of the first work function layer; and a second gate stack extending over the fin and having a longitudinal axis orthogonal to the first direction, the second gate stack having a fourth width in the first direction and including a second gate dielectric layer having outermost sidewalls spaced apart by a fifth width in the first direction, a second work function layer having outermost sidewalls spaced apart by a sixth width in the first direction less than the fifth width and having innermost sidewalls spaced apart by a seventh width in the first direction less than the sixth width, and a second gate electrode having outermost sidewalls spaced apart by the seventh width, where a topmost surface of the second gate electrode forms a step with a topmost surface of the second work function layer.

Yet another general aspect includes a device including: a fin field effect transistor (FINFET) device structure, including: an isolation structure formed over a substrate; a fin structure formed over the substrate; and a first gate structure and a second gate structure formed over the fin structure, where the first gate structure has a first width in a direction parallel to the fin structure, the second gate structure has a second width in a direction parallel to the fin structure, and the first width is smaller than the second width, and where the first gate structure includes a first gate dielectric layer, a first work function layer, a first gate electrode surrounded by the first work function layer, and a first capping layer, the first capping layer having a first thickness over the first gate dielectric layer, a second thickness over the first work function layer and a third thickness, less than the first thickness and the second thickness over the first gate electrode; the second gate structure includes a second gate dielectric layer second work function layer, a second gate electrode surrounded by the second work function layer, and a second capping layer overlying the second gate stack, the second capping layer having a fourth thickness over the first gate dielectric layer, a fifth thickness over the second work function layer and a sixth thickness, less than the fifth thickness and the sixth thickness, over the second gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations here in without departing from the spirit and scope of the present disclosure.

What is claimed is:

1. A fin field effect transistor (FinFET) device structure, comprising:
    an isolation structure formed over a substrate;
    a fin structure formed over the substrate, the isolation structure being adjacent the fin structure; and
    a first gate structure and a second gate structure formed over the fin structure and the isolation structure, wherein the first gate structure has a first width in a direction parallel to the fin structure, the second gate structure has a second width in a direction parallel to the fin structure, and the first width is smaller than the second width, and wherein
    the first gate structure comprises a first set of spacers, a first work function layer between the first set of spacers, a first gate electrode surrounded by the first work function layer, and a first mask layer on the first work function layer and the first gate electrode, the first mask layer being between the first set of spacers, a step being between a topmost surface of the first gate electrode and a topmost surface of the first work function layer, the first work function layer having a first height which is measured from a top surface of the isolation structure to a top surface of the first gate structure; and
    the second gate structure comprises a second work function layer and a second gate electrode surrounded by the second work function layer and a step between a topmost surface of the second gate electrode and a topmost surface of the second work function layer, the second work function layer having a second height which is measured from a top surface of the isolation structure to a top surface of the second gate structure, a top surface of the first gate electrode being level with a top surface of the second gate electrode; wherein a top surface of the first work function layer is lower than a top surface of the second work function layer.

2. The fin field effect transistor (FinFET) device structure as claimed in claim 1, wherein the first gate structure further comprises a first gate dielectric layer, and a top surface of the first gate electrode is located at a position that is higher than a top surface of the first gate dielectric layer.

3. The fin field effect transistor (FinFET) device structure as claimed in claim 2, wherein the top surface of the first gate dielectric layer is located at a position that is higher than a top surface of the first work function layer.

4. The fin field effect transistor (FinFET) device structure as claimed in claim 2, wherein the second gate structure further comprises a second gate dielectric layer and a second gate electrode layer, and a top surface of the second gate dielectric layer is level with a top surface of the first gate dielectric layer.

5. The fin field effect transistor (FinFET) device structure as claimed in claim 1, wherein a gap between the first height and the second height is in a range from about 1 nm to about 6 nm.

6. The fin field effect transistor (FinFET) device structure as claimed in claim 5, wherein the gap between the first height and the second height is in a range from about 2 nm to about 4 nm.

7. The fin field effect transistor (FinFET) device structure as claimed in claim 2, wherein the first gate dielectric layer comprises a material selected from the group consisting of silicon oxide ($SiO_x$), silicon nitride ($Si_xN_y$), silicon oxynitride (SiON), dielectric material(s) with low dielectric constant (low-k), and combinations thereof, carbon doped silicon oxide, amorphous fluorinated carbon, parylene, bis-benzocyclobutenes (BCB), polytetrafluoroethylene (PTFE) (Teflon), silicon oxycarbide polymers (SiOC), porous hydrogen silsesquioxane (HSQ), porous methyl silsesquioxane (MSQ), porous polyarylether (PAE), porous SiLK, and porous silicon oxide ($SiO_2$).

8. The fin field effect transistor (FinFET) device structure as claimed in claim 1, wherein the first work function layer comprises a material selected from the group consisting of tungsten (W), copper (Cu), titanium (Ti), silver (Ag), aluminum (Al), titanium aluminum alloy ($TiA_l$), titanium aluminum nitride ($TiA_lN$), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru) and combinations thereof.

9. The fin field effect transistor (FinFET) device structure as claimed in claim 1, wherein the first gate electrode comprises a material selected from the group consisting of aluminum (Al), copper (Cu), tungsten (W), titanium (Ti), and tantalum (Ta).

10. The fin field effect transistor (FinFET) device structure as claimed in claim 1, wherein the first gate electrode has a height above the substrate that is greater than the height above the substrate of the second gate electrode.

11. A device comprising:
a fin extending from a semiconductor substrate, the fin having a longitudinal axis in a first direction;
a first gate stack extending over the fin and having a longitudinal axis orthogonal to the first direction, the first gate stack having a first width in the first direction and including a first gate dielectric layer having outermost sidewalls spaced apart by the first width, a first work function layer having outermost sidewalls spaced apart by a second width in the first direction less than the first width and having innermost sidewalls spaced apart by a third width in the first direction less than the second width, and a first gate electrode having outermost sidewalls spaced apart by the third width, wherein a topmost surface of the first gate electrode forms a step with a topmost surface of the first work function layer; and
a second gate stack extending over the fin and having a longitudinal axis orthogonal to the first direction, the second gate stack having a fourth width in the first direction and including a second gate dielectric layer having outermost sidewalls spaced apart by a fifth width in the first direction, a second work function layer having outermost sidewalls spaced apart by a sixth width in the first direction less than the fifth width and having innermost sidewalls spaced apart by a seventh width in the first direction less than the sixth width, and a second gate electrode having outermost sidewalls spaced apart by the seventh width, wherein a topmost surface of the second gate electrode forms a step with a topmost surface of the second work function layer, and wherein a top surface of the first work function layer is lower than a top surface of the second work function layer, wherein a difference in height between the first work function layer and the second work function layer is in a range from about 1 nm to about 6 nm.

12. The device as claimed in claim 11, wherein the first gate stack further comprises a first gate dielectric layer and a first gate electrode layer, and a top surface of the first gate electrode layer is located at a position that is higher than a top surface of the first gate dielectric layer.

13. The device as claimed in claim 12, wherein the top surface of the first gate dielectric layer is located at a position that is higher than a top surface of the first work function layer.

14. The device as claimed in claim 12, wherein the second gate stack further comprises a second gate dielectric layer and a second gate electrode layer, and a top surface of the second gate dielectric layer is level with a top surface of the first gate dielectric layer.

15. The device as claimed in claim 11, wherein a difference in height between the first work function layer and the second work function layer is in a range from about 2 nm to about 4 nm.

16. A fin field effect transistor (FinFET) device structure comprising:
an isolation structure formed over a substrate; a fin structure formed over the substrate; and
a first gate structure and a second gate structure formed over the fin structure and the isolation structure, wherein the first gate structure has a first width in a direction parallel to the fin structure, the second gate structure has a second width in a direction parallel to the fin structure, and the first width is smaller than the second width, and wherein
the first gate structure comprises a first set of spacers, a first gate dielectric layer between the first set of spacers, a first work function layer, a first gate electrode surrounded by the first work function layer, and a first capping layer, the first capping layer having a first thickness over the first gate dielectric layer, a second thickness over the first work function layer and a third thickness, over the first gate electrode, the third thickness being less than the first thickness and the second thickness, the second thickness being greater than the first thickness and the third thickness, the first gate electrode being separated from the first set of spacers by the first capping layer; and
the second gate structure comprises a second set of spacers, a second gate dielectric layer between the second set of spacers, a second work function layer, a second gate electrode surrounded by the second work function layer, and a second capping layer, the second capping layer having a fourth thickness over the first gate dielectric layer, a fifth thickness over the second work function layer and a sixth thickness, over the second gate electrode, the sixth thickness being less than the fourth thickness and the fifth thickness, the fifth thickness being greater than the fourth thickness and the sixth thickness, the second gate electrode being separated from the second set of spacers by the second capping layer and wherein the fifth thickness is less than the second thickness.

17. The FinFET device as claimed in claim 16, wherein a difference in height above a topmost surface of the isolation structure between the first work function layer and the second work function layer is in a range from about 1 nm to about 6 nm.

18. The FinFET device of claim 1, wherein the first work function layer and the second work function layer have a same material composition.

19. The FinFET device of claim 16, wherein a difference in height between the first work function layer and the second work function layer is in a range from about 1 nm to about 6 nm.

* * * * *